US008580681B2

(12) United States Patent
Sako

(10) Patent No.: US 8,580,681 B2
(45) Date of Patent: Nov. 12, 2013

(54) MANUFACTURING METHOD OF DEVICE

(75) Inventor: Nobuyuki Sako, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/553,916

(22) Filed: Jul. 20, 2012

(65) Prior Publication Data
US 2013/0029487 A1    Jan. 31, 2013

(30) Foreign Application Priority Data

Jul. 27, 2011    (JP) .................................. 2011-164572

(51) Int. Cl.
*H01L 21/44*    (2006.01)
(52) U.S. Cl.
USPC .... 438/666; 257/308; 257/309; 257/E21.014; 257/E21.587; 257/E21.648; 438/239; 438/253; 438/396
(58) Field of Classification Search
USPC .................. 257/308, 309, E21.014, E21.587, 257/E21.648; 438/239, 253, 396, 666
See application file for complete search history.

(56) References Cited

U.S. PATENT DOCUMENTS

| 7,723,202 | B2 * | 5/2010 | Eto | 438/396 |
| 7,897,474 | B2 * | 3/2011 | Eto | 438/396 |
| 8,164,129 | B2 * | 4/2012 | Uchiyama | 257/296 |
| 2007/0108493 | A1 * | 5/2007 | Iijima | 257/308 |
| 2011/0076819 | A1 * | 3/2011 | Kim et al. | 438/279 |
| 2011/0207303 | A1 * | 8/2011 | Jeong et al. | 438/487 |
| 2011/0207304 | A1 * | 8/2011 | Kim et al. | 438/487 |
| 2011/0291172 | A1 * | 12/2011 | Hwang et al. | 257/314 |
| 2012/0012920 | A1 * | 1/2012 | Shin et al. | 257/324 |
| 2012/0068242 | A1 * | 3/2012 | Shin et al. | 257/315 |
| 2012/0094453 | A1 * | 4/2012 | Han et al. | 438/269 |
| 2012/0115293 | A1 * | 5/2012 | Noh et al. | 438/239 |
| 2012/0267702 | A1 * | 10/2012 | Jee et al. | 257/324 |
| 2012/0276719 | A1 * | 11/2012 | Han et al. | 438/478 |
| 2013/0011977 | A1 * | 1/2013 | Tang et al. | 438/164 |
| 2013/0065381 | A1 * | 3/2013 | Son et al. | 438/479 |

FOREIGN PATENT DOCUMENTS

JP    2003-142605    5/2003

* cited by examiner

*Primary Examiner* — Asok K Sarkar
(74) *Attorney, Agent, or Firm* — Young & Thompson

(57) ABSTRACT

A device manufacturing method includes: sequentially forming a first sacrificial film, a first support film, a second sacrificial film, and a second support film on a semiconductor substrate; forming a hole to pass through these films; forming a crown-shaped electrode covering an inner surface of the hole and connected to the second support film and the first support film; forming a first opening in the second support film into a first pattern designed such that the connection between the crown-shaped electrode and the second support film is at least partially maintained; removing at least a part of the second sacrificial film through the first opening; forming a second opening in the first support film with use of the first opening; and removing the first sacrificial film through the second opening. This method is able to prevent misalignment of openings between the support films.

12 Claims, 20 Drawing Sheets

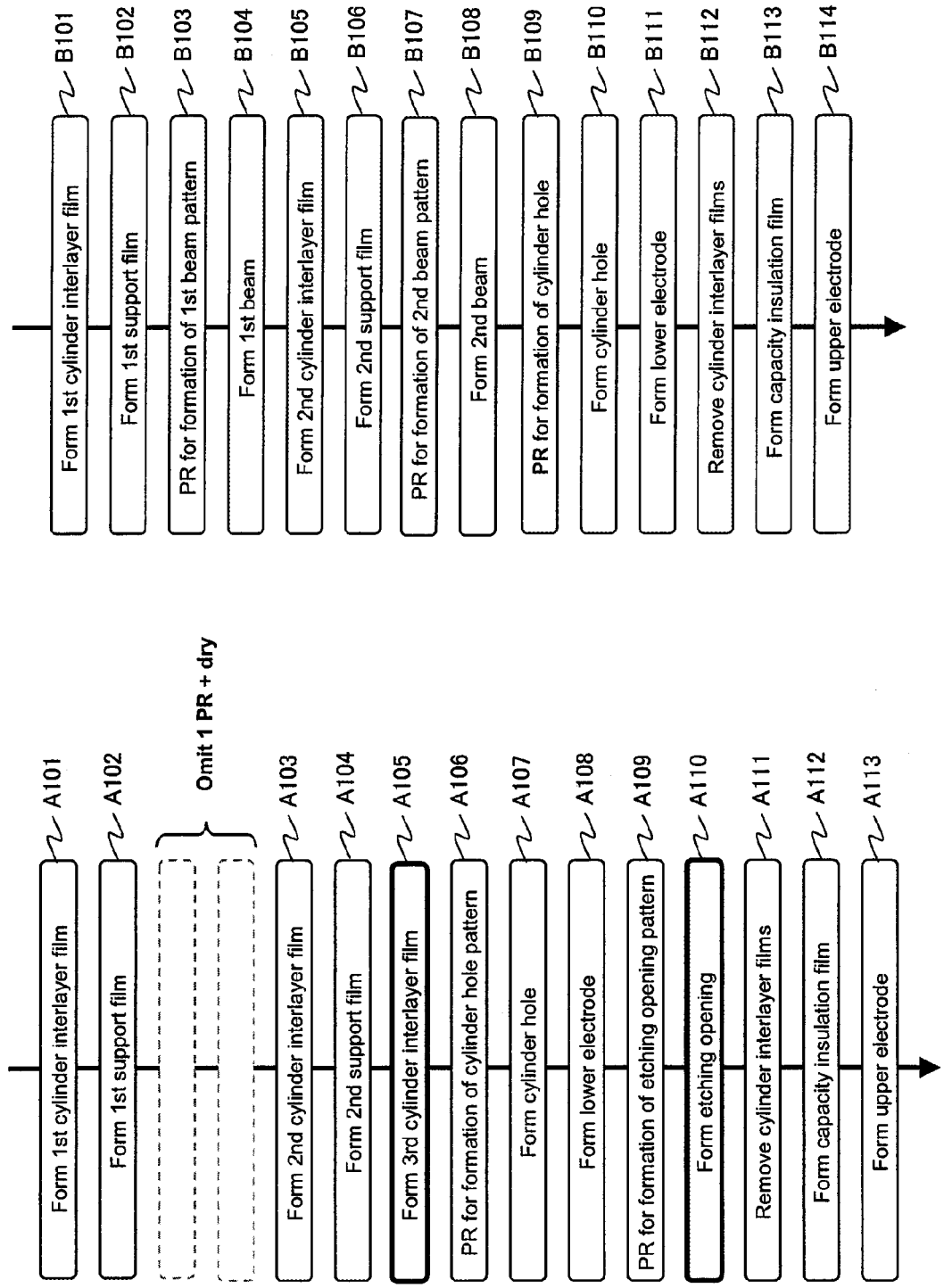

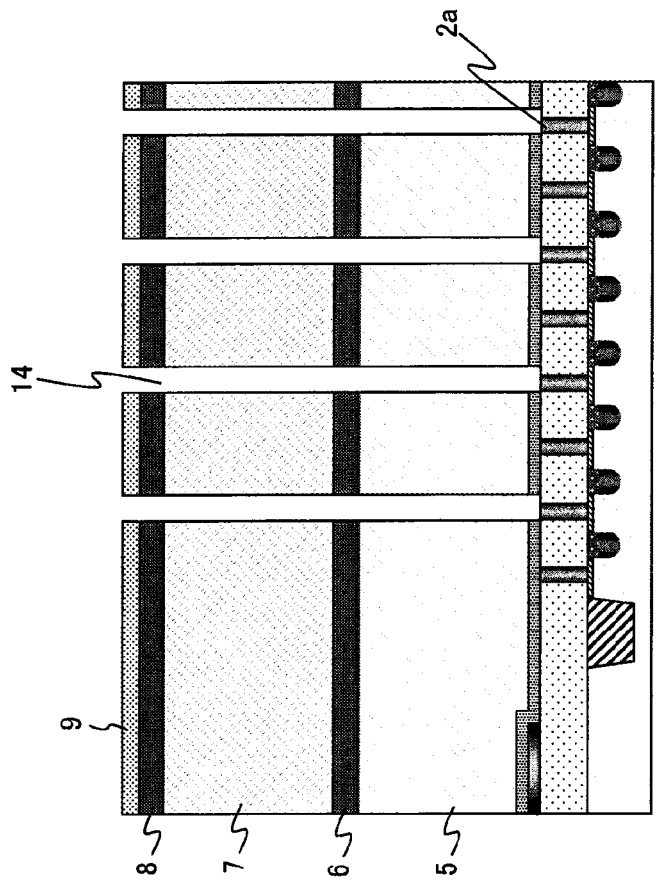
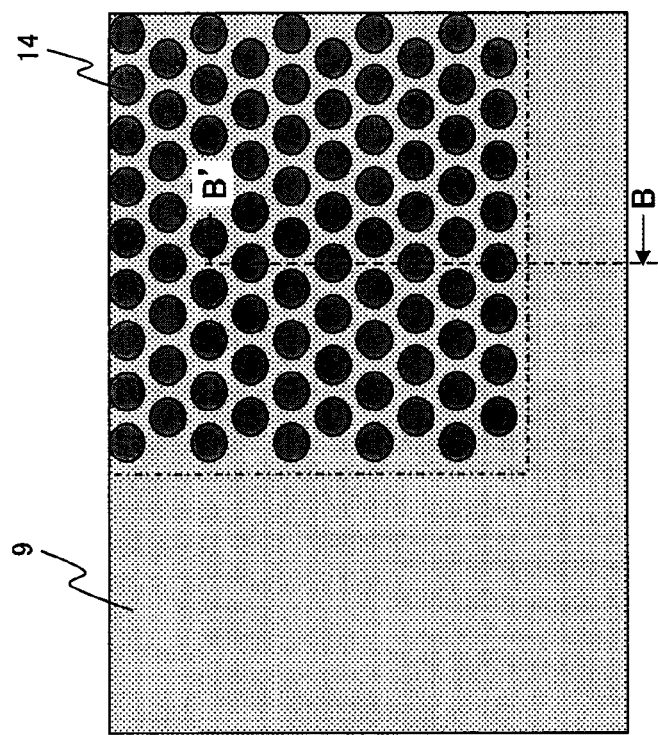
FIG. 3B
FIG. 3A

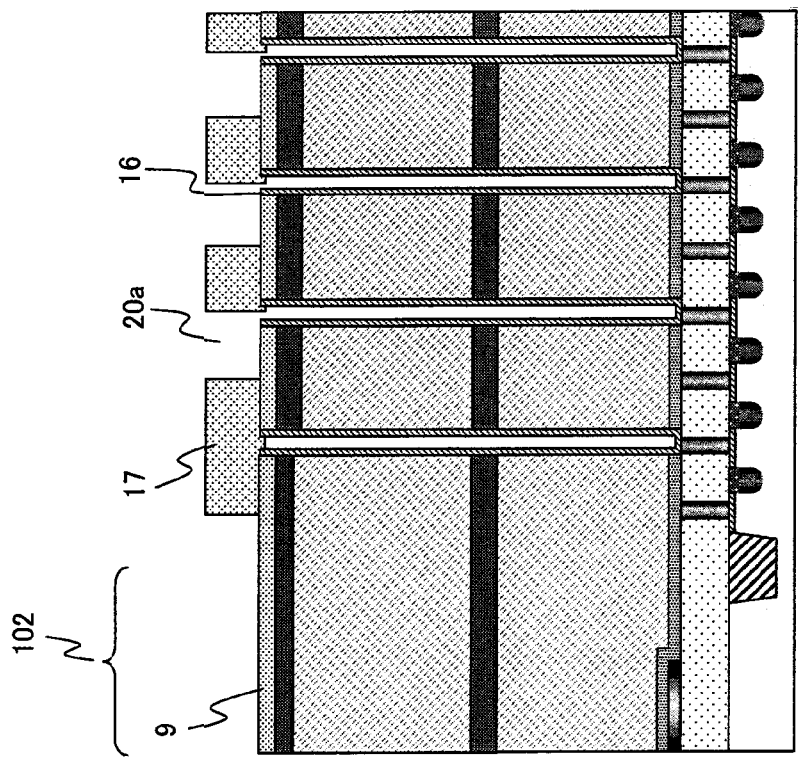
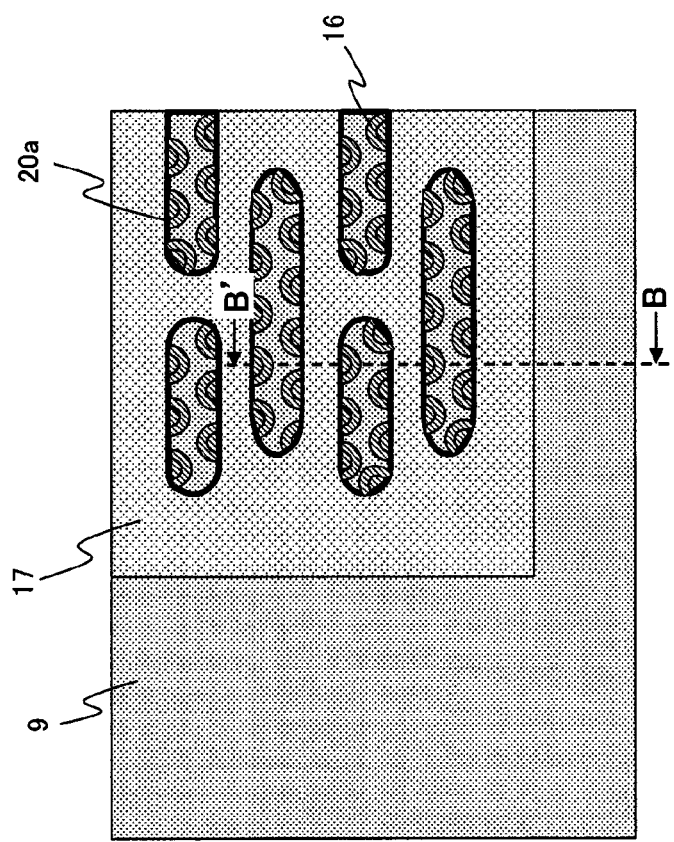
FIG. 7B
FIG. 7A

MANUFACTURING METHOD OF DEVICE

This application claims priority to prior Japanese application JP 2011-164572, the disclosure of which is incorporated herein by reference.

BACKGROUND OF THE INVENTION

This invention relates to a manufacturing method of a semiconductor device, and in particular to a manufacturing method of a semiconductor device having a structure, in which lower electrodes of crown-shaped capacitors are supported by a plurality of support films.

In a related-art semiconductor device manufacturing method, plural insulator beams are formed sequentially from the lower layer side. This type of technique is disclosed for example in Japanese Laid-Open Patent Publication No. 2003-142605.

More specifically, a first insulating beam film is formed on a first sacrificial insulating film and then the first insulating beam film is selectively etched to form a first insulator beam having a desired pattern. Subsequently, a second sacrificial insulating film and a second insulating beam film are sequentially formed on the first insulator beam and the exposed first sacrificial insulating film. In the same manner as for the first insulating beam film, the second insulating beam film is selectively etched to form a second insulator beam having a desired pattern.

Subsequently, through holes are formed to pass through the second insulator beam, the second sacrificial insulating film, the first insulator beam and the first sacrificial insulating film, and a conductive film functioning as lower electrodes of capacitors is formed so as to cover the inner surfaces of the through holes. The conductive film thus formed is connected to the second insulator beam and first insulator beam exposed in the through holes.

After that, the lower electrodes can be supported by the second insulator beam and first insulator beam even if the second sacrificial insulating film and the first sacrificial insulating film are removed. Thus, the lower electrodes can be prevented from collapsing, and crown-shaped capacitors having a higher aspect ratio can be formed.

SUMMARY OF THE INVENTION

According to the related-art manufacturing method of a semiconductor device, a plurality of insulator beams are formed one by one from the lower layer side and then through holes are formed therein. If there occurs a misalignment between the position of an insulator beam pattern and the position where the through hole is formed, a lower electrode formed within the through hole will possibly not be connected to any or all of the insulator beams. It is expected that such a problem will occur more frequently as the miniaturization of semiconductor devices is advanced.

In one embodiment, there is provided a method that includes: sequentially forming a first sacrificial film, a first support film, a second sacrificial film, and a second support film on a semiconductor substrate; forming a hole to pass through the second support film, the second sacrificial film, the first support film, and the first sacrificial film; forming a crown-shaped electrode covering an inner surface of the hole and connected to the second support film and the first support film; forming a first opening in the second support film into a first pattern which is designed such that a connection between the crown-shaped electrode and the second support film is at least partially maintained; removing at least a part of the second sacrificial film through the first opening; forming a second opening in the first support film with use of the first opening; and removing the first sacrificial film through the second opening.

In another embodiment, there is provided a method that includes: stacking alternately a plurality of sacrificial films and a plurality of support films; forming a crown-shaped electrode which passes through the plurality of sacrificial film layers and the plurality of support film layers and is connected to the plurality of support film layers; forming a first opening in an uppermost layer of the plurality of support film layers, into a first pattern which is designed such that the connection with the crown-shaped electrode is at least partially maintained; forming a corresponding opening corresponding to the first opening in each of the plurality of support film layers except for the upper most layer with use of the first opening such that the connection with the crown-shaped electrode is at least partially maintained for all of the plurality of support film layers except for the upper most layer; and removing the plurality of sacrificial films through the first opening and the corresponding opening.

BRIEF DESCRIPTION OF THE DRAWINGS

The above features and advantages of the present invention will be more apparent from the following description of certain preferred embodiments taken in conjunction with the accompanying drawings, in which:

FIG. 1A is a flowchart showing primary steps of a manufacturing method according to this invention;

FIG. 1B is a flowchart showing primary steps of a related-art manufacturing method of a semiconductor device;

FIG. 3A is a diagram for explaining steps following the steps shown in FIGS. 2A and 2B, being a plan view showing a semiconductor device on the way of manufacture;

FIG. 3B is a cross-sectional view taken along the line B-B' in FIG. 3A;

FIG. 7A is a diagram for explaining steps following the steps shown in FIGS. 6A and 6B, being a plan view showing a semiconductor device on the way of manufacture;

FIG. 7B is a cross-sectional view taken along the line B-B' in FIG. 7A;

DETAILED DESCRIPTION OF PREFERRED EMBODIMENTS

Figure 2B:
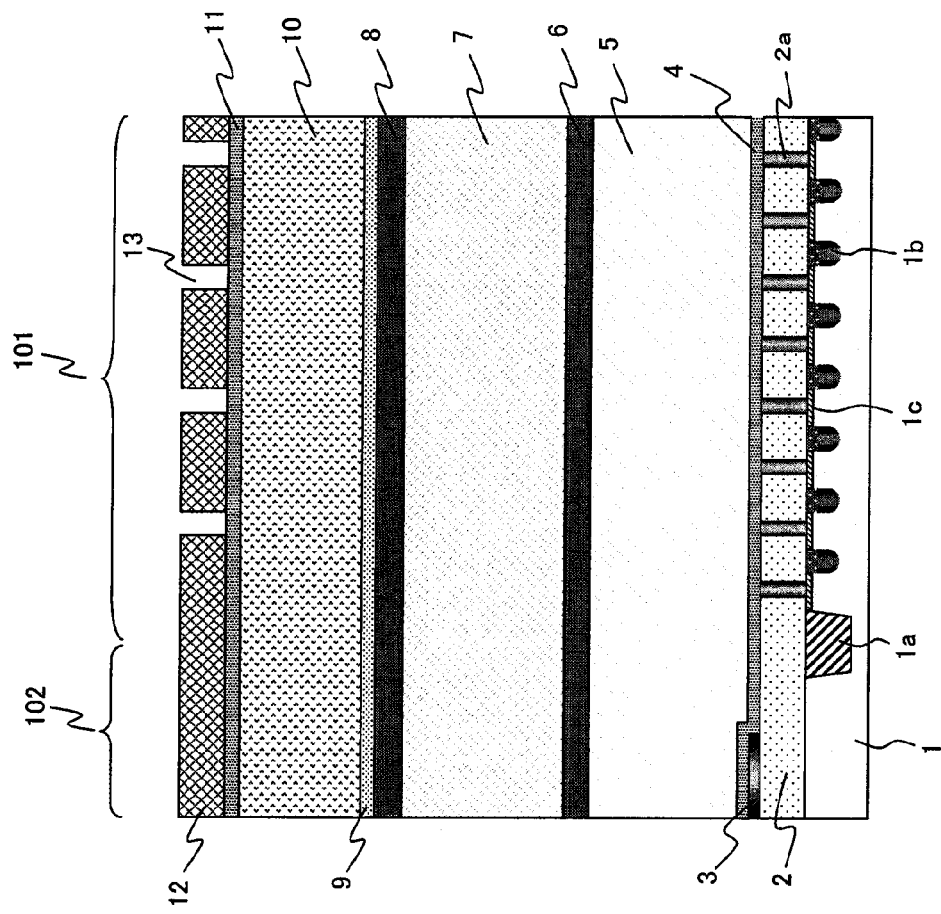
FIG. 2B is a cross-sectional view taken along the line B-B' in FIG. 2A.

Exemplary preferred embodiments of the invention will be described with reference to the accompanying drawings.

Referring to FIGS. 1A and 1B, this invention will be schematically described in comparison with a related-art semiconductor device manufacturing method in order to facilitate understanding of the invention.

FIG. 1A is a flowchart illustrating primary steps of a manufacturing method of a semiconductor device according to the invention, while FIG. 1B is a flowchart illustrating primary steps of the related-art manufacturing method of a semiconductor device. The manufacturing method of the invention aims to perform a patterning lithography (PR) process for a plurality of support films in a single step, which has conventionally been carried out in a plurality of steps.

The related-art semiconductor device manufacturing method will be schematically described below.

Firstly, a first cylinder interlayer film (first sacrificial film) is formed on a semiconductor substrate (step B101), and a first support film is formed thereon (step B102).

Next, a photoresist mask having a first beam pattern is formed on the first support film by photolithography (PR) (step B103). The first support film is then etched by dry etching using the photoresist mask to form a first beam made of the first support film (step B104). The first beam pattern is a lattice pattern formed by straight lines which are repeatedly arranged in X and Y directions. Cylinder holes are formed at intersections of this lattice pattern in a later step.

Subsequently, a second cylinder interlayer film (second sacrificial film) is formed on the entire surface to cover the first beam (step B105), and a second support film is formed thereon (step B106).

Next, a second beam made of a second support film is formed by the same steps as steps B103 and B104 (steps B107 and B108). The second beam pattern is the same as the first beam pattern.

Subsequently, a photoresist mask having a cylinder hole pattern is formed by photolithography (PR) on the second support film and the exposed second cylinder interlayer film (step B109). The second beam, the second cylinder interlayer film, the first beam, and the first cylinder interlayer film are etched sequentially by dry etching using the photoresist mask to form cylinder holes (step B110).

A conductor film is formed on the entire surface including the inner surface of the cylinder holes, and then the conductor formed on the second support film is removed while the conductors are left only on the inner surfaces of the cylinder holes, whereby lower electrodes are formed (step B111). As a result, the lower electrodes are in contact with the first and the second beams. Specifically, each of the lower electrodes has an outer peripheral surface. The outer peripheral surface is in contact with linear beams (or the first beam), which extend in the X and Y directions, at four points. Similarly, the outer peripheral surface is in contact with linear beams (or the second beam), which extend in the X and Y directions, at four points.

Next, the second cylinder interlayer film and the first cylinder interlayer film are removed by solution etching (step B112). The second cylinder interlayer film and the first cylinder interlayer film may be each made of a silicon oxide film while the first beam and the second beam may be each made of a silicon nitride film. Therefore, the second cylinder interlayer film and the first cylinder interlayer film can be selectively removed with the first and second beams left unremoved. The lower electrodes are supported (interconnected) by the first and second beams, whereby the lower electrodes can be prevented from collapsing due to removal of the second cylinder interlayer film and the first cylinder interlayer film.

Next, a capacity insulating film is formed on the surface of a structure consisting of the lower electrodes, the first beam, and the second beam (step B113). An upper electrode is then formed to cover the surface of the capacity insulating film (step B114).

Capacitors having crown-shaped lower electrodes are fabricated in this manner.

In contrast, in a manufacturing method of a semiconductor device according to this invention, a second cylinder interlayer film is formed without performing PR for formation of the first beam pattern or the first beam formation (steps B103 and B104) (step A103).

In addition, according to the method of the invention, steps of PR for cylinder hole pattern formation (step A106), cylinder hole formation (step A107), and lower electrode formation (step A108) are performed prior to steps (steps A109 and A110) corresponding to the PR for second beam pattern formation and the second beam formation (steps B107 and B108). For this purpose, a third cylinder interlayer film formation step (step A105) is additionally provided. This step does not require alignment.

After this, PR for etching opening pattern formation corresponding to the PR for second beam pattern formation is performed to form an etching mask (step A109), and an opening pattern is formed on the second support film by using this etching mask (step A110). Further, using the first opening formed in the second support film, removal of the second cylinder interlayer film, formation of a second opening in the first support film, and removal of the first cylinder interlayer film are carried out (step A111). The formation of the second opening is implemented by anisotropic dry etching.

After that, formation of a capacity insulating film (step A112) and formation of an upper electrode (step A113) are performed, whereby capacitors having crown-shaped lower electrodes are completed.

According to the manufacturing method of a semiconductor device of the invention as described above, the PR processes for formation of the first beam can be omitted. This makes it possible to prevent occurrence of deficiency due to misalignment that might possibly be caused during a plurality of PR processes.

Next, a manufacturing method of a semiconductor device according to a first embodiment of the invention will be described with reference to FIGS. 2A to 13. Although the following description will be made in terms of a DRAM (Dynamic Random Access Memory) as an example of a semiconductor device, the invention is applicable to semiconductor devices other than DRAM as long as they are configured such that a structure having a high aspect ratio is supported by means of a plurality of support films. Dry etching used in this embodiment is used for performing anisotropic etching.

A DRAM has a memory cell area in which a plurality of memory cells are arranged, and a peripheral circuit area for driving the memory cells. Each of FIGS. 2A to 12B except FIG. 11 partially illustrates an area around the periphery between the memory area and the peripheral circuit area in a DRAM which is being fabricated. FIGS. 2A to 12A (drawings with a suffix of A) are plan views, while FIGS. 2B to 12B (drawings with a suffix of B) are cross-sectional views taken along the line B-B' in corresponding drawings with a suffix of A.

Figure 2A:
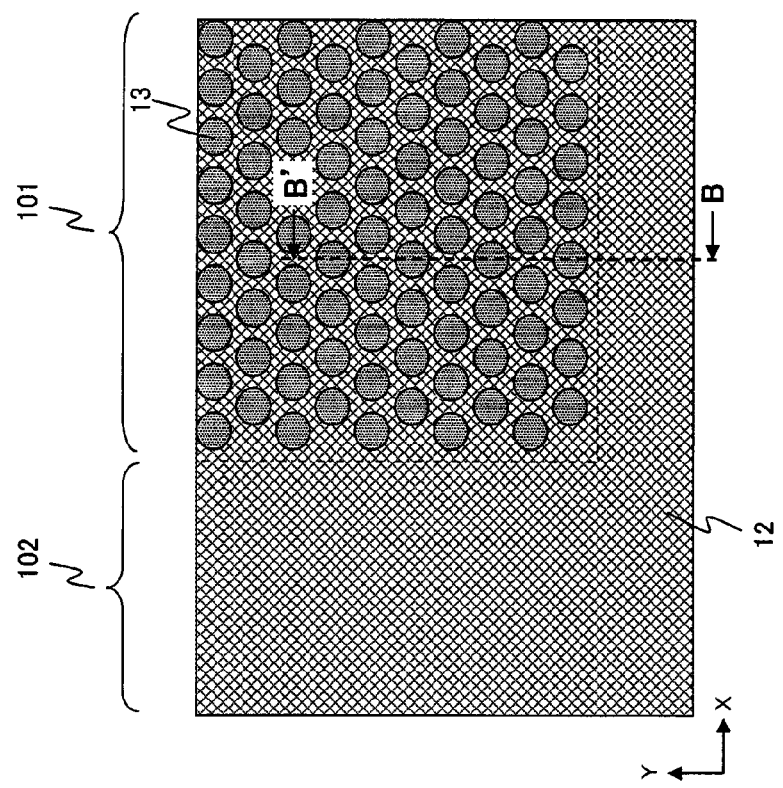
FIG. 2A is a diagram for explaining a manufacturing method of a semiconductor device according to a first embodiment of the invention, being a plan view showing a semiconductor device on the way of manufacture.

Firstly, a state as shown in FIGS. 2A and 2B is obtained by using a known technique.

More specifically, an element isolation region 1a, buried gate electrodes 1b, diffusion regions 1c and so on are formed on a semiconductor substrate 1. An interlayer insulation film 2 is formed on the semiconductor substrate 1 and, further, capacity contact plugs 2a passing through the interlayer insulation film 2 and a peripheral wiring 3 are formed thereon. A stopper silicon nitride film 4, a first cylinder interlayer film (first sacrificial film) 5, a first silicon nitride film (first support film) 6, a second cylinder interlayer film (second sacrificial film) 7, a second silicon nitride film (second support film) 8, a third cylinder interlayer film 9, an amorphous carbon film 10, and a silicon oxide film 11 are sequentially stacked thereon. After that, a photoresist 12 is formed on the silicon oxide film 11, and a cylinder hole pattern 13 is formed in the photoresist 12.

In this embodiment, neither the first silicon nitride film 6 nor the second silicon nitride film 8 is subjected to a pattern formation process, but the second cylinder interlayer film 7 and the third cylinder interlayer film 9 are formed on the upper faces thereof, respectively.

The semiconductor substrate 1 is, for example, a p-type single crystal silicon substrate. The semiconductor substrate 1 is electrically separated into a memory cell area 101 and a peripheral circuit area 102 by means of an element isolation region 1a.

The buried gate electrodes 1b and the diffusion regions 1c formed in the memory cell area 101 form transistors. The buried gate electrodes 1b also function as word lines. The capacity contact plugs 2a are connected to the diffusion regions 1c, and also connected to bit lines (not shown).

The stopper silicon nitride film 4 is formed into a thickness of 50 nm on the entire surface of the semiconductor substrate 1 by using a CVD (Chemical Vapor Deposition) process, for example.

The first cylinder interlayer film 5 is, for example, an impurity-containing silicon oxide film, and is formed into a thickness of 450 nm by using a CVD process. The impurity-containing silicon oxide film may be made of BPSG (Boro-Phospho Silicate Glass) containing boron (B) and phosphorus (P). Since the impurity-containing silicon oxide film is etched rapidly with an etching solution, it can be removed easily in a later process.

The first silicon nitride film 6 is formed, for example, by a CVD process into a thickness of 50 nm. The first silicon nitride film 6 can be formed by a sputtering method or a HDP (High Density Plasma) process. A film formed by sputtering or HDP is very dense, and can be etched with a solution at a lower etching rate than a film formed by a CVD process. Unlike the related-art semiconductor device manufacturing method, the first silicon nitride film is not patterned at this point.

The second cylinder interlayer film 7 and the second silicon nitride film 8 are formed into a thickness of thickness 450 nm and a thickness of 50 nm, respectively, by the same methods as the first cylinder interlayer film 5 and the first silicon nitride film 6. The second silicon nitride film 8 is not patterned either at this point.

The third cylinder interlayer film 9 is, for example, a silicon oxide film, and is formed by a CVD process into a thickness of 30 nm. Alternatively, the third cylinder interlayer film 9 may be formed by a sputtering method or a HDP process.

The amorphous carbon film 10 is formed, for example, by a CVD process into a thickness of 1000 nm.

The silicon oxide film 11 is formed into a thickness of 50 nm, for example, by a CVD process.

The cylinder hole pattern 13 in the photoresist 12 is formed, for example, by using a lithography process. Openings forming the cylinder hole pattern 13 each correspond to a position where a capacitor is to be formed, and are formed in the memory cell area 101. As shown in FIG. 2A, a multiplicity of the openings may be arranged in a close-packed manner. The openings may have a diameter of 50 to 150 nm, and the closest distance between adjacent openings may be 30 to 50 nm. In such a close-packed pattern in which a multiplicity of the openings are arranged in a staggered fashion, the distance between adjacent openings, that is, the distance between capacitors is small, and hence it is difficult to arrange linear beams repeatedly in X and Y direction as in the aforementioned related-art semiconductor device manufacturing method. This embodiment employs a configuration, as described later, in which openings are formed in the support film so that support is provided by a plane instead of the beams.

Next, the silicon oxide film 11 is etched with the photoresist 12 used as a mask by a dry etching process using fluorine-containing plasma, so that the cylinder hole pattern 13 in the photoresist 12 is transferred to the silicon oxide film 11. As a result, a part of the upper surface of the amorphous carbon film 10 is exposed in the bottoms of the holes.

Subsequently, the exposed amorphous carbon film 10 is etched by a dry etching process using oxygen plasma so that the cylinder hole pattern 13 is transferred to the amorphous carbon film 10. The photoresist 12 used as the mask disappears during etching of the amorphous carbon film 10. However, the silicon oxide film 11, which is not etched by oxygen plasma, functions as a new mask even though it is thin. Therefore, the amorphous carbon film 10 can be etched according to the cylinder hole pattern 13 until a part of the upper surface of the third cylinder interlayer film 9 is exposed in the bottoms of the holes.

Subsequently, by using, as a mask, the amorphous carbon film 10 having the cylinder hole pattern 13 transferred thereto and the silicon oxide film 11 left unetched on the upper surface thereof, the third cylinder interlayer film 9, the second silicon nitride film 8, the second cylinder interlayer film 7, the first silicon nitride film 6, the first cylinder interlayer film 5, and the stopper silicon nitride film 4 are etched sequentially by a dry etching process using fluorine-containing plasma. As a result of this, cylinder holes (indicated by 14 in FIG. 3B) are formed to reach the capacity contact plugs 2a, while the upper surfaces of the capacity contact plugs 2a are partially exposed in the holes. The silicon oxide film 11 used as the mask disappears during the etching, but the amorphous carbon film 10 remains unetched and functions as a mask.

After etching the stopper silicon nitride film 4, the amorphous carbon film 10 left unetched as a mask is removed by an oxygen plasma dry etching process so that the upper surface of the third cylinder interlayer film 9 is exposed. As a result of this, a state shown in FIGS. 3A and 3B is obtained.

Although in this embodiment, the amorphous carbon film 10 is used as a mask for forming the cylinder holes 14, the invention is not limited to this, and a silicon film, a film of a metal silicide such as tungsten silicide or titanium silicide, a film of a metal compound such as titanium nitride or tungsten nitride, or a film of a metal such as aluminum, tungsten, or nickel can be used. Since a film of a metallic material is difficult to be etched or is not etched at all by fluorine plasma, such a film is effective as a mask and desirable for high precision processing of the cylinder holes 14.

Figure 4B:
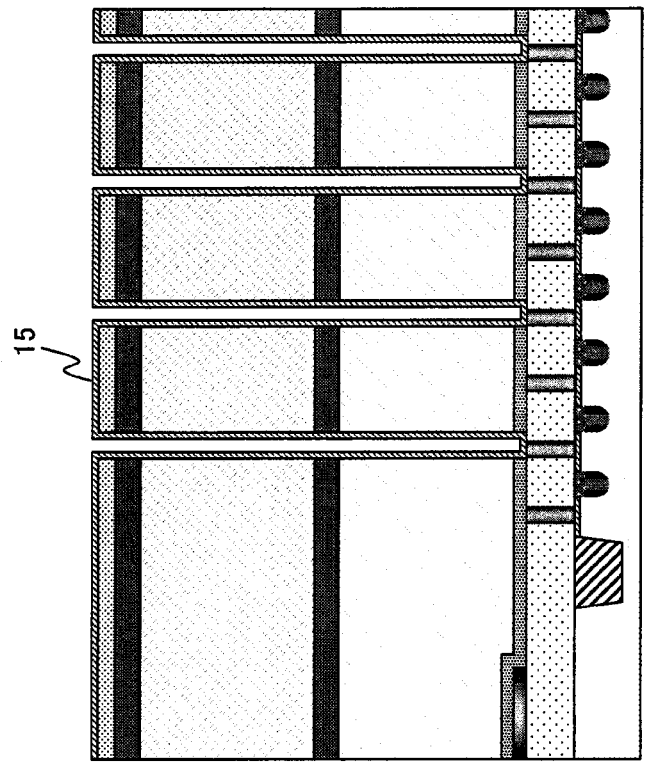
FIG. 4B is a cross-sectional view taken along the line B-B' in FIG. 4A.
Figure 4A:
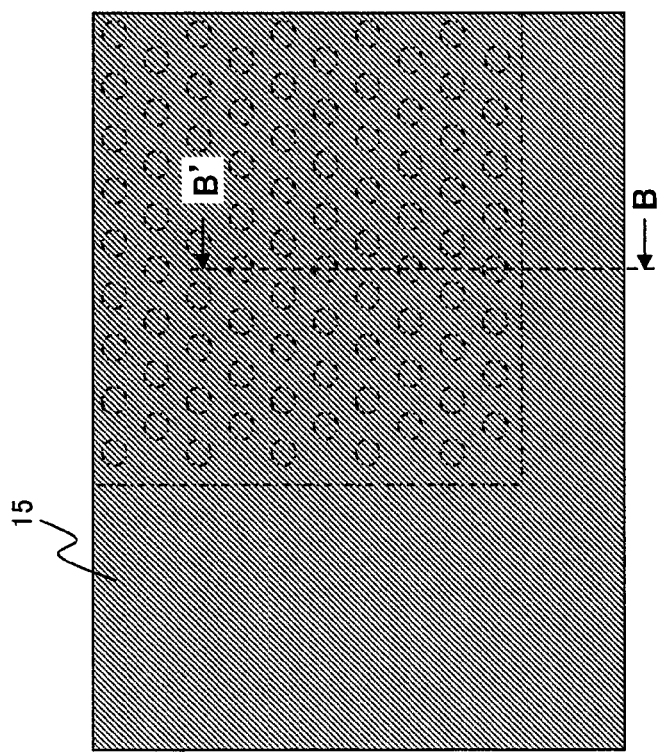
FIG. 4A is a diagram for explaining steps following the steps shown in FIGS. 3A and 3B, being a plan view showing a semiconductor device on the way of manufacture.

As shown in FIGS. 4A and 4B, a lower electrode material film 15 is formed on the entire surface including the upper surface of the third cylinder interlayer film 9 and the inner surfaces of the cylinder holes 14. Titanium nitride can be used as the material of the lower electrode material film 15. The formation of the lower electrode material film 15 can be performed by a CVD process or an ALD (Atomic Layer Deposition) process. The thickness of the lower electrode material film 15 is selected in such a range that the total of the thickness of the lower electrode material film 15 and the thickness of the capacity insulating film to be formed in a later step is smaller than a half of the diameter of the cylinder holes. For example, the thickness of the lower electrode material film 15 may be 10 nm.

Figure 5B:
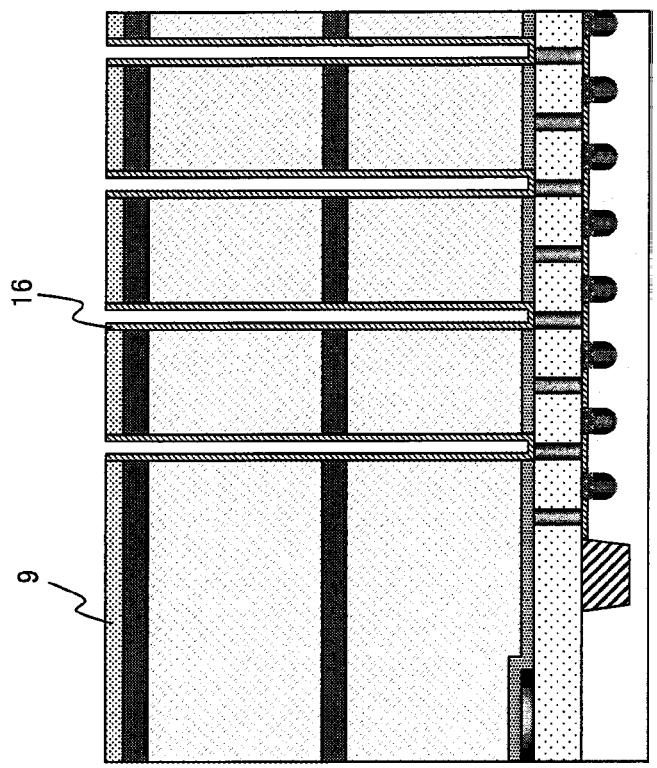
FIG. 5B is a cross-sectional view taken along the line B-B' in FIG. 5A.
Figure 5A:
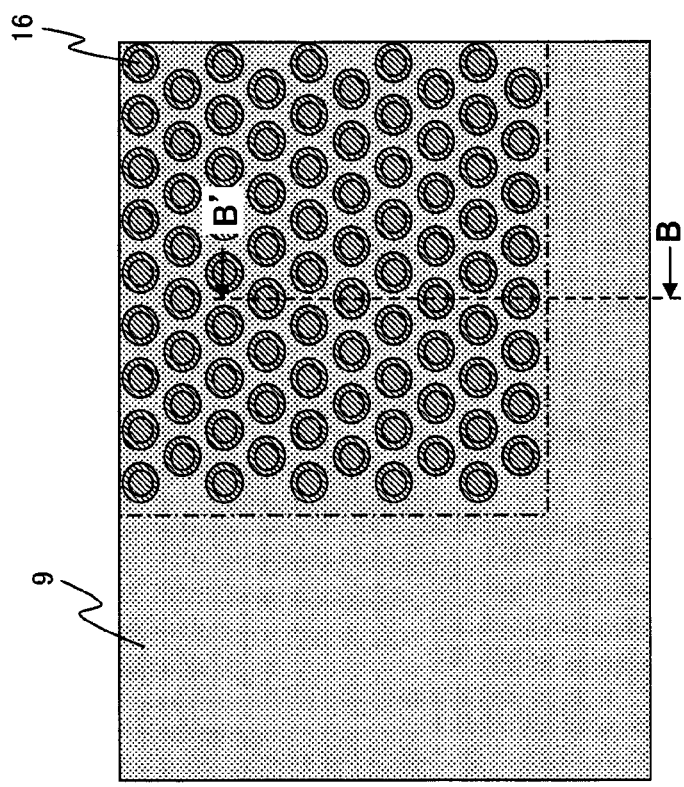
FIG. 5A is a diagram for explaining steps following the steps shown in FIGS. 4A and 4B, being a plan view showing a semiconductor device on the way of manufacture.

Then, the lower electrode material film 15 is entirely etched back so that, as shown in FIGS. 5A and 5B, the lower electrode material film 15 formed on the upper surface of the third cylinder interlayer film 9 is removed. This etching back can be performed by a dry etching process using chlorine-containing plasma. As a result of this, crown-shaped lower electrodes 16 can be formed, which cover the inner surfaces of the respective cylinder holes 14 and are connected to the upper surfaces of the capacity contact plugs 2a. The outer peripheral surface of each of the lower electrodes 16 is connected to the first silicon nitride film 6 and the second silicon nitride film 8.

Figure 6B:
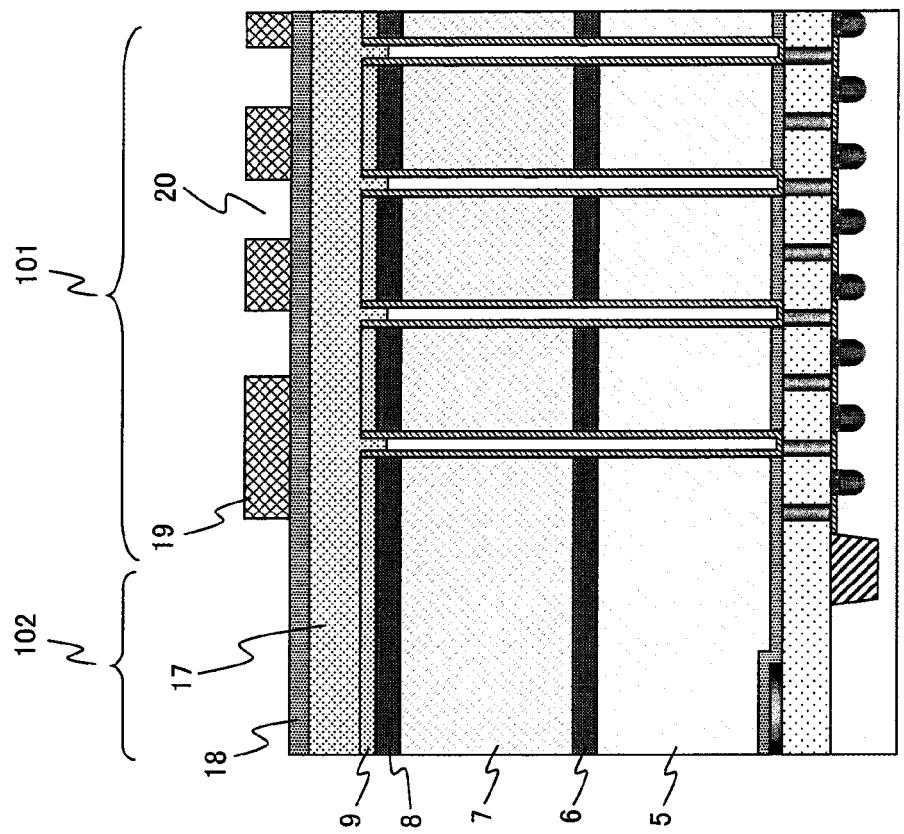
FIG. 6B is a cross-sectional view taken along the line B-B' in FIG. 6A.
Figure 6A:
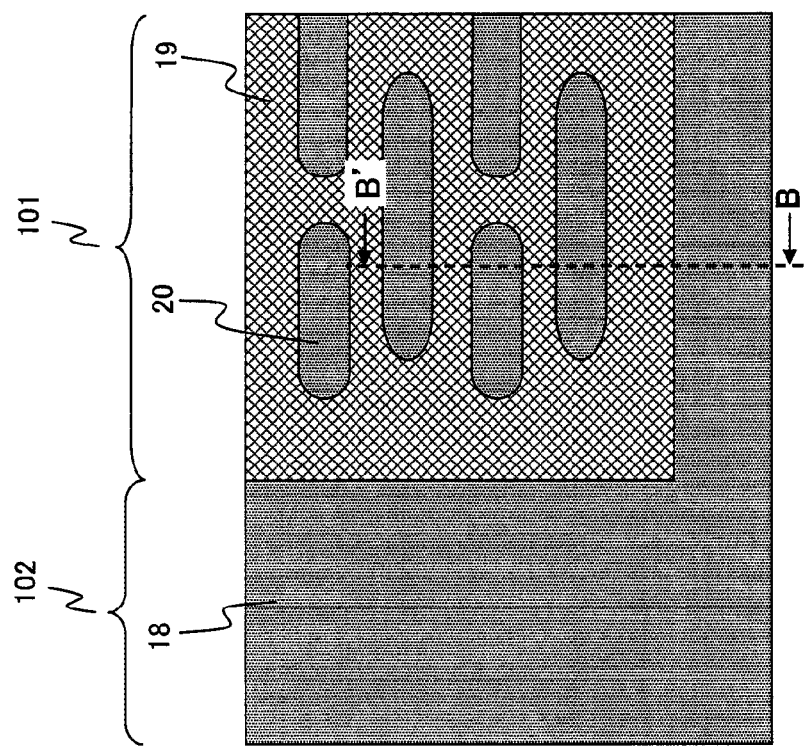
FIG. 6A is a diagram for explaining steps following the steps shown in FIGS. 5A and 5B, being a plan view showing a semiconductor device on the way of manufacture.

Next, as shown in FIGS. 6A and 6B, a plasma silicon nitride film 17, an anti-reflection film 18, and a photoresist 19 are sequentially formed on the entire upper surface of the third cylinder interlayer film 9.

The plasma silicon nitride film 17 is formed, for example, by a plasma CVD process into a thickness of 150 nm. Since this method is poor in step coverage, the plasma silicon nitride film 17 is not formed in the inside of the lower electrodes 16 but is formed to close the openings of the lower electrodes 16.

The anti-reflection film 18 is formed on the entire upper surface of the plasma silicon nitride film 17 by a spin-coating method, for example.

The photoresist 19 is formed, for example, by a spin-coating method on the entire upper surface of the anti-reflection film 18. An etching opening pattern 20 is formed in the photoresist 19 by a photolithography process. The photoresist 19 located in the peripheral circuit area 102 is also removed during formation of the etching opening pattern 20.

The etching opening pattern 20 defines openings for etching away the cylinder interlayer films 9, 7 and 5 in a later step. This means that the etching opening pattern 20 define openings to be formed in the first and second silicon nitride films 6 and 8. Since the first and second silicon nitride films 6 and 8 function as support films for supporting the lower electrodes 16, the openings formed therein should be as small as possible. Therefore, the etching opening pattern 20 is designed such that the openings formed in the first and second silicon nitride films 6 and 8 have a minimum necessary area. Whereas in the related-art semiconductor device manufacturing method, the lower electrodes are supported by the beams, the lower electrodes are supported by a plane in this embodiment. The area of the remaining part of each of the first and second silicon nitride films 6 and 8 should be greater at least than the area of the openings. FIG. 6A shows an example in which the openings have an oblong shape with rounded corners.

Next, the anti-reflection film 18 and the plasma silicon nitride film 17 are sequentially dry etched with the photoresist 19 used as a mask, so that the etching opening pattern 20 is transferred to the anti-reflection film 18 and the plasma silicon nitride film 17. Fluorine-containing plasma can be used for this etching. After that, the photoresist 19 used as the mask and the anti-reflection film 18 are removed by dry etching using oxygen plasma. As a result, a state as shown in FIGS. 7A and 7B is obtained.

As shown in FIGS. 7A and 7B, a part of the upper surface of the third cylinder interlayer film 9 and a part of the upper surface of each lower electrode 16 are exposed in each of openings 20a formed in the plasma silicon nitride film 17. The upper surface of the third cylinder interlayer film 9 is exposed in the peripheral circuit area 102.

Figure 8B:
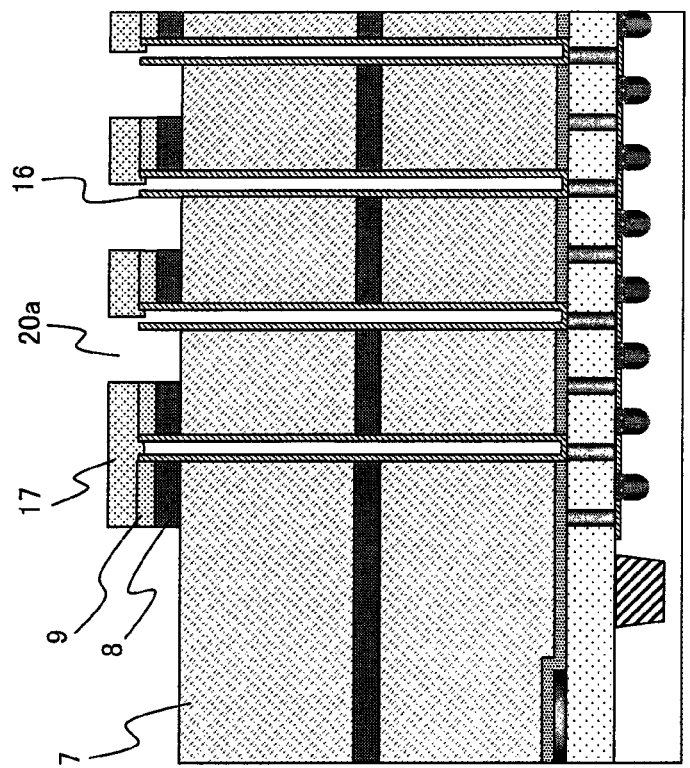
FIG. 8B is a cross-sectional view taken along the line B-B' in FIG. 8A.
Figure 8A:
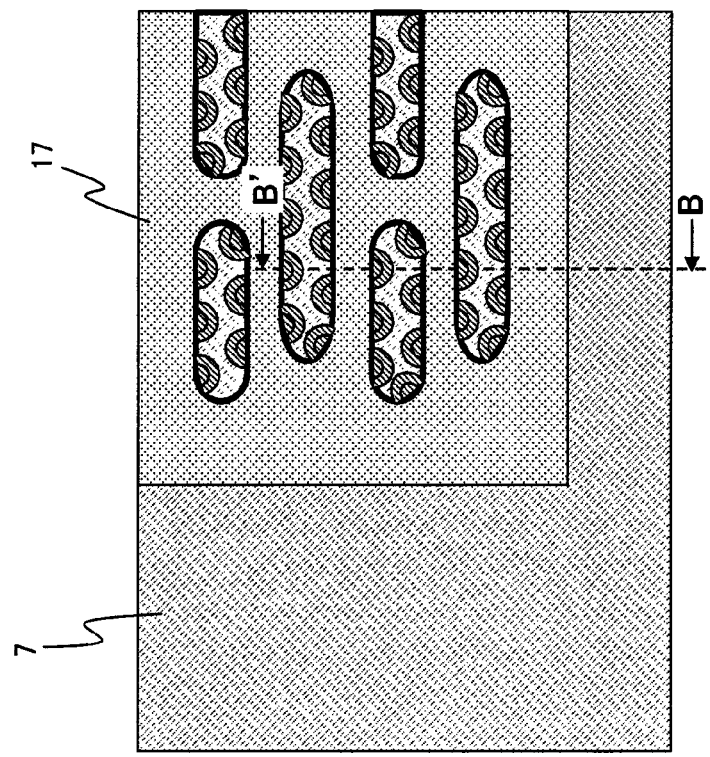
FIG. 8A is a diagram for explaining steps following the steps shown in FIGS. 7A and 7B, being a plan view showing a semiconductor device on the way of manufacture.

As shown in FIGS. 8A and 8B, the exposed third cylinder interlayer film 9 is then dry etched with the plasma silicon nitride film 17 used as a mask, and subsequently the second silicon nitride film 8 is dry etched. Fluorine-containing plasma can be used for this etching process. As a result of this, first openings according to the etching opening pattern 20 is formed in the second silicon nitride film 8, whereby the upper surface of the second cylinder interlayer film 7 is partially exposed. In this step, the thickness of the plasma silicon nitride film 17 is reduced to about a half of the original thickness when it is formed.

Figure 9B:
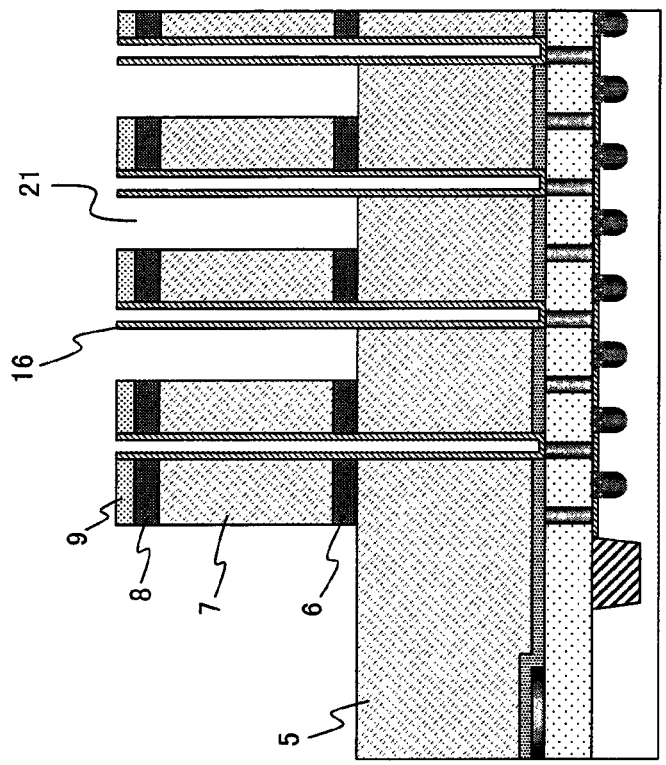
FIG. 9B is a cross-sectional view taken along the line B-B' in FIG. 9A.
Figure 9A:
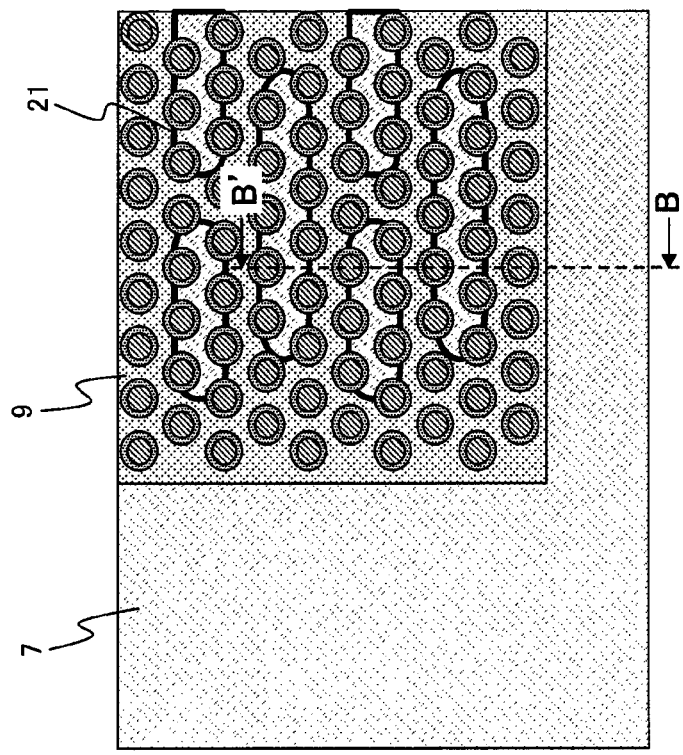
FIG. 9A is a diagram for explaining steps following the steps shown in FIGS. 8A and 8B, being a plan view showing a semiconductor device on the way of manufacture.

The dry etching process using fluorine-containing plasma with the plasma silicon nitride film 17 used as a mask is continued so that, as shown in FIGS. 9A and 9B, the exposed second cylinder interlayer film 7 and first silicon nitride film 6 are sequentially dry etched. As a result of this, second openings according to the etching opening pattern 20 are formed in the first silicon nitride film 6, and the upper surface of the first cylinder interlayer film 5 is partially exposed.

The plasma silicon nitride film 17 used as the mask also disappears by being etched away during this process. In other words, the original thickness of the plasma silicon nitride film 17 when it is formed is controlled such that the plasma silicon nitride film 17 disappears at this stage of the process. If the plasma silicon nitride film 17 does not disappear completely and partially remains, isotropic plasma etching is additionally performed to completely remove the remaining plasma silicon nitride film 17. Since the upper surface of the second silicon nitride film 8 is covered with the third cylinder interlayer film 9 made of a silicon oxide film, the second silicon nitride film 8 will not be etched from the upper surface thereof and will not disappear even after this additional etching.

In this manner, the etching openings 21 can be formed in common in the second silicon nitride film 8 and first silicon nitride film 6 by a single dry etching process. In each of the etching openings 21, there are exposed a side wall of the second cylinder interlayer film 7 and a part of the upper surface of the first cylinder interlayer film 5, and also parts of the upper surface and the outer wall of the lower electrode 16. Further, the upper surfaces of the lower electrodes 16 are exposed in the memory cell area other than the etching openings 21.

Figure 10B:
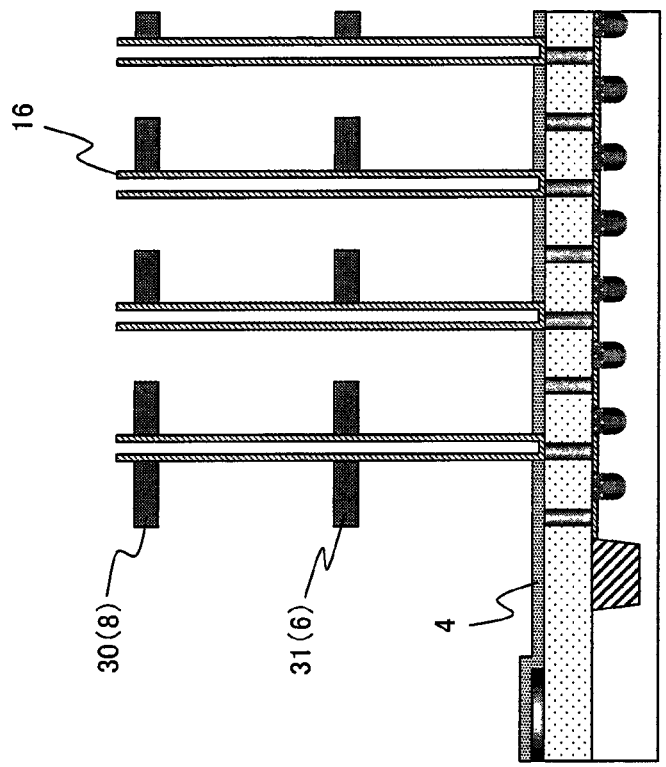
FIG. 10B is a cross-sectional view taken along the line B-B' in FIG. 10A.
Figure 10A:
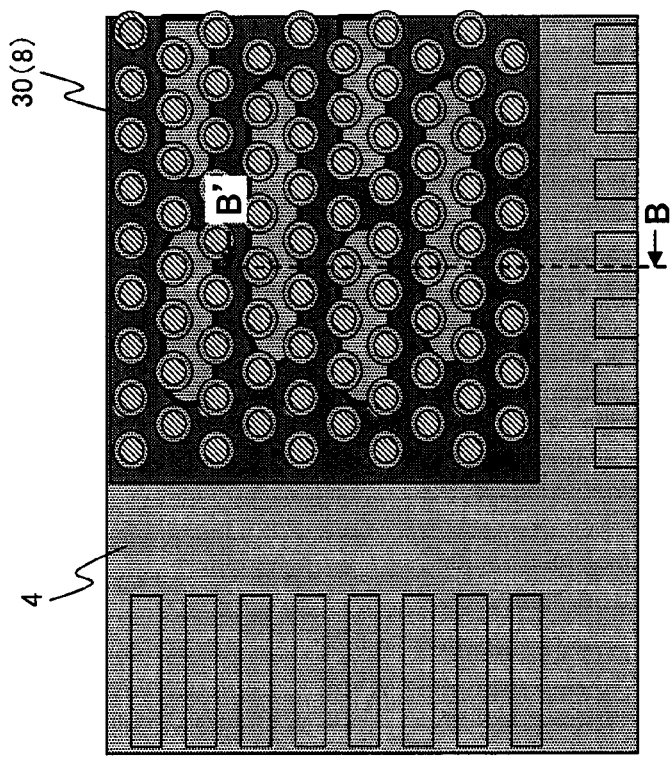
FIG. 10A is a diagram for explaining steps following the steps shown in FIGS. 9A and 9B, being a plan view showing a semiconductor device on the way of manufacture.

As shown in FIGS. 10A and 10B, the third cylinder interlayer film 9, the second cylinder interlayer film 7 and the first cylinder interlayer film 5 which are made of silicon oxide films are entirely removed by a wet etching process using a hydrofluoric-acid-containing solution.

In the case of wet etching using a hydrofluoric-acid-containing solution, the etching rate of a silicon nitride film is as low as about 1/100 of the etching rate of a silicon oxide film. The lower electrode 16 made of a metal material is not etched with the hydrofluoric-acid-containing solution. Therefore, the first cylinder interlayer film 5, the second cylinder interlayer film 7 and the third cylinder interlayer film 9 made of silicon oxide films can be selectively removed by the wet etching using the hydrofluoric-acid-containing solution.

As a result, the plurality of lower electrodes 16 formed in the memory cell area are connected at their upper parts to a first support member 30 formed of the second silicon nitride film 8, and are interconnected while they are connected at their central parts to a second support member 31 formed of the first silicon nitride film 6. The outer walls of the plurality of lower electrodes 16 are totally exposed except the parts thereof connected to the support members 30 and 31. Structures including transistors and wirings formed on the semiconductor substrate 1 are covered with the stopper silicon nitride film 4 and hence will not be etched away.

The etching opening pattern 20, that is, the etching openings 21 for the support members 30 and 31 to be eventually formed will be described in detail with reference to FIG. 11.

Figure 11:
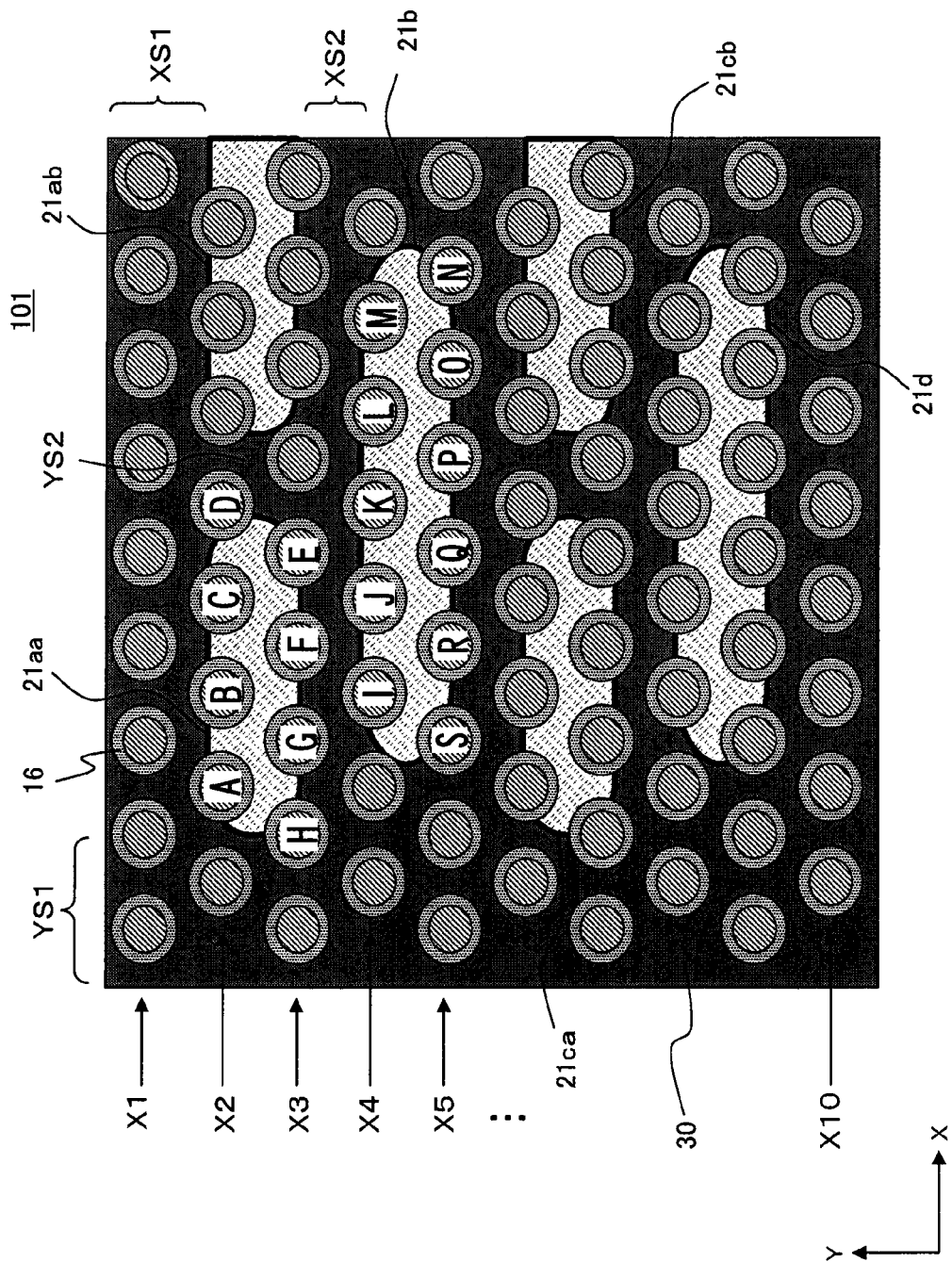
FIG. 11 is an enlarged view of a part of FIG. 10A.

FIG. 11 is a diagram showing in an enlarged fashion a part of FIG. 10A, that is, the memory cell area 101. The plurality of lower electrodes 16 arranged in the memory cell area 101 form a plurality of lower electrode groups extending in an X direction. These lower electrode groups shall be referred to as X1, X2, X3, . . . beginning at the top of the drawing. In order to realize the close-packing, the lower electrodes are arranged such that the lower electrode groups X2, X4, . . . in even-numbered rows are displaced in an X direction by a half pitch with respect to the lower electrode groups X1, X3, X5, . . . in odd-numbered rows.

FIG. 11 shows six etching openings 21. More specifically, they are openings 21aa and 21ab formed to extend over the lower electrode groups X2 and X3, an opening 21b formed to extend over the lower electrodes X4 and X5, openings 21ca and 21cb formed to extend over the lower electrode groups X6 and X7, and an opening 21d formed to extend over the lower electrode groups X8 and X9.

The openings 21aa, 21ab and the openings 21ca, 21cb have the same size. The opening 21b and the opening 21d also have the same size, and are longer than the openings 21aa, 21ab and openings 21ca, 21cb in the X direction.

The opening 21aa is formed so as to expose a part of the outer walls of eight lower electrodes 16 in total, namely, lower electrodes A, B, C, D belonging to the lower electrode group X2 and lower electrodes E, F, G, and H belonging to the lower electrode group X3. This means that the opening 21aa is formed to extend over two adjacent lower electrode groups. Likewise, the other etching openings 21 are also formed to extend over two adjacent lower electrode groups.

The aforementioned arrangement of the etching openings 21 is illustrative only, and other different arrangement of the openings 21 may be employed. For example, only the openings 21b and 21d can be provided, or only the openings 21aa, 21ab, 21ca, and 21cb can be provided. Alternatively, the longitudinal direction of the openings 21 can be different from the one shown in the drawing. For example, one of the openings 21 may be formed so as to expose a part of the outer walls of the lower electrodes A, G, I, R, Q, J, F, and B shown in FIG. 11. In this case as well, the etching openings 21 are formed so as not to completely include any of the lower electrodes. This is because when one of the etching openings 21 is formed to include the lower electrodes A, G, I, R, Q, J, F, B, C, E, K, and P, for example, the lower electrodes F and J located near a central part are isolated from the first support member 30. In this case, the lower electrodes F and J will not able to be supported by the first support member and may possibly collapse. Therefore, the etching openings 21 should be formed such that contact between each of the lower electrodes 16 and the first support member 30 is maintained at least partially.

The first support member 30 is not a beam connecting between the lower electrodes as the one used in the related-art semiconductor device manufacturing method, but it has a shape planarly spreading. In this embodiment of the invention, the outer walls of most of the lower electrodes 16 are in contact with the first support member 30 at their entire outer periphery. Even a lower electrode 16 which is partially exposed in an etching opening 21 formed in a part of the first support member 30 is connected to the first support member 30 at its outer wall other than the outer wall located in the opening.

According to this embodiment, as described above, each of the lower electrodes 16 formed in the memory cell area 101 is connected to the first support member 30 spreading planarly continuously at a part of its outer wall in the entire or part of the periphery thereof.

In FIG. 11, each of the lower electrodes belonging to the lower electrode group X1 in a support region XS1 is connected to the first support member 30 at a part of its outer wall in the entire periphery. The same goes for the lower electrodes belonging to the lower electrode group X10.

When viewed in a Y direction as well, each of the lower electrodes 16 located in a support region YS1 is connected to the first support member 30 at a part of its outer wall in the entire periphery thereof. A support region YS2 is defined by a region which connects the support region XS1 and a support region XS2 planarly in a Y direction.

The second support member 31 located in a lower layer assumes the same configuration as the first support member 30.

Figure 12B:
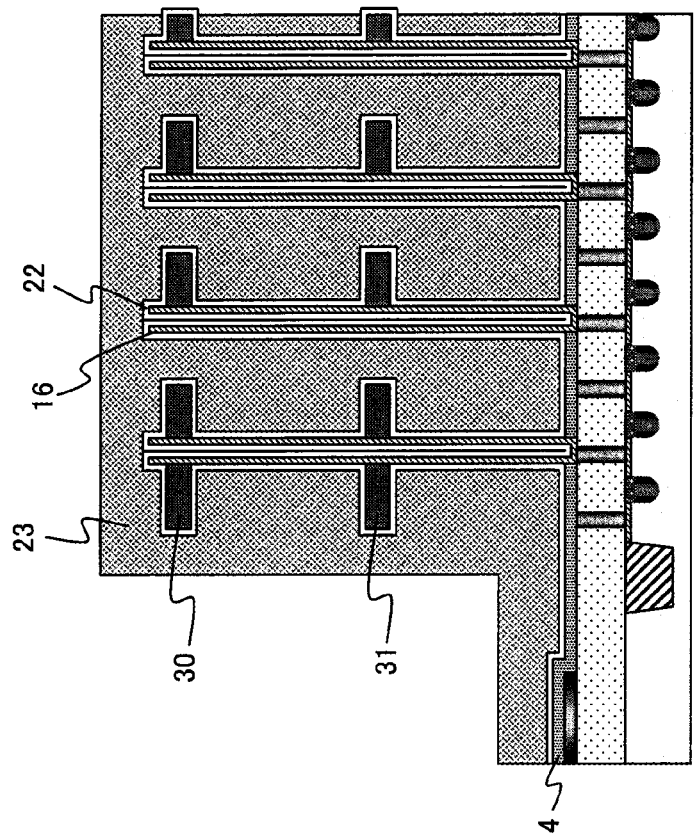
FIG. 12B is a cross-sectional view taken along the line B-B' in FIG. 12A.
Figure 12A:
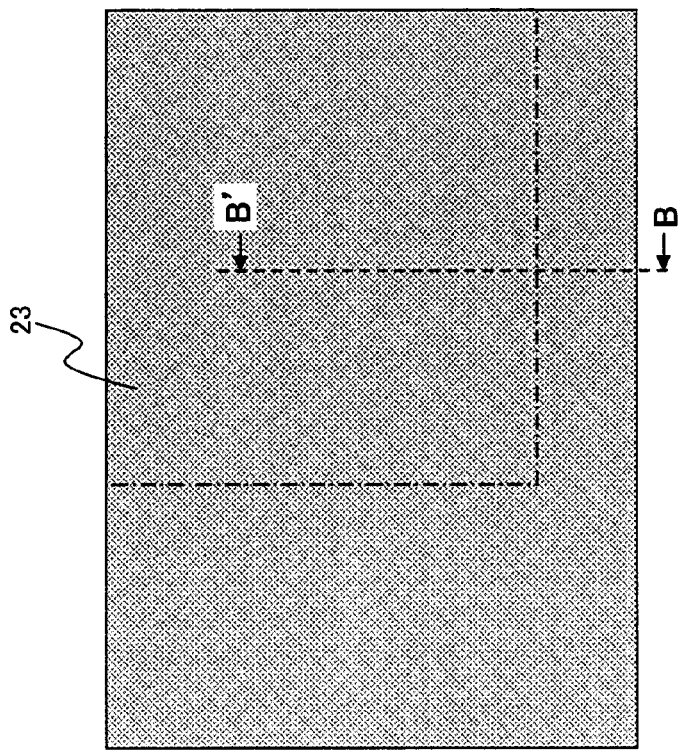
FIG. 12A is a diagram for explaining steps following the steps shown in FIGS. 10A and 10B, being a plan view showing a semiconductor device on the way of manufacture.

Returning to the description of the manufacturing processes, after totally removing the first, second and third cylinder interlayer films 5, 7 and 9, a capacity insulating film 22 is formed on the entire surface including the inner surfaces and outer wall surfaces of the lower electrodes 16, as shown in FIGS. 12A and 12B. The capacity insulating film 22 is also formed on the surfaces of the first support member 30 and second support member 31, and on the upper surface of the stopper silicon nitride film 4. The capacity insulating film 22 can be formed of a single-layer film selected from a group consisting of a zirconium oxide film, an aluminum oxide film, a titanium oxide film, a tantalum oxide film, and a hafnium oxide film, or a laminated film consisting of a plurality of films selected from the group mentioned above. All of these films can be formed by an ALD method. The capacity insulating film 22 has a thickness of 6 nm, for example.

After the formation of the capacity insulating film 22, an upper electrode 23 is formed to cover the surface of the capacity insulating film 22 and to fill the gaps between the lower electrodes 16. The upper electrode 23 is formed, for example, by sequentially stacking a titanium nitride film, a boron-doped silicon film, and a boron-doped silicon-germanium film by a CVD process.

In this embodiment, position control is performed such that the upper surface of the first support member 30 is situated at a lower level than the upper surfaces of the lower electrodes 16. This position control is carried out by means of the thickness of the third cylinder interlayer film 9. If the level of the upper surface of the first support member 30 is the same as the level of the upper surfaces of the lower electrodes 16, the openings of the lower electrodes 16 will be closed by the capacity insulating film 22 when it is formed. In order to avoid this, the upper surfaces of the lower electrodes 16 are formed to project above the upper surface of the first support member 30. The height of the parts of the lower electrodes 16 projecting above the first support film 30 must be at least four times greater than the thickness of the capacity insulating film 22. When the capacity insulating film 22 has a thickness of 6 nm, the third cylinder interlayer film 9 may have a thickness of 30 nm.

Figure 13:
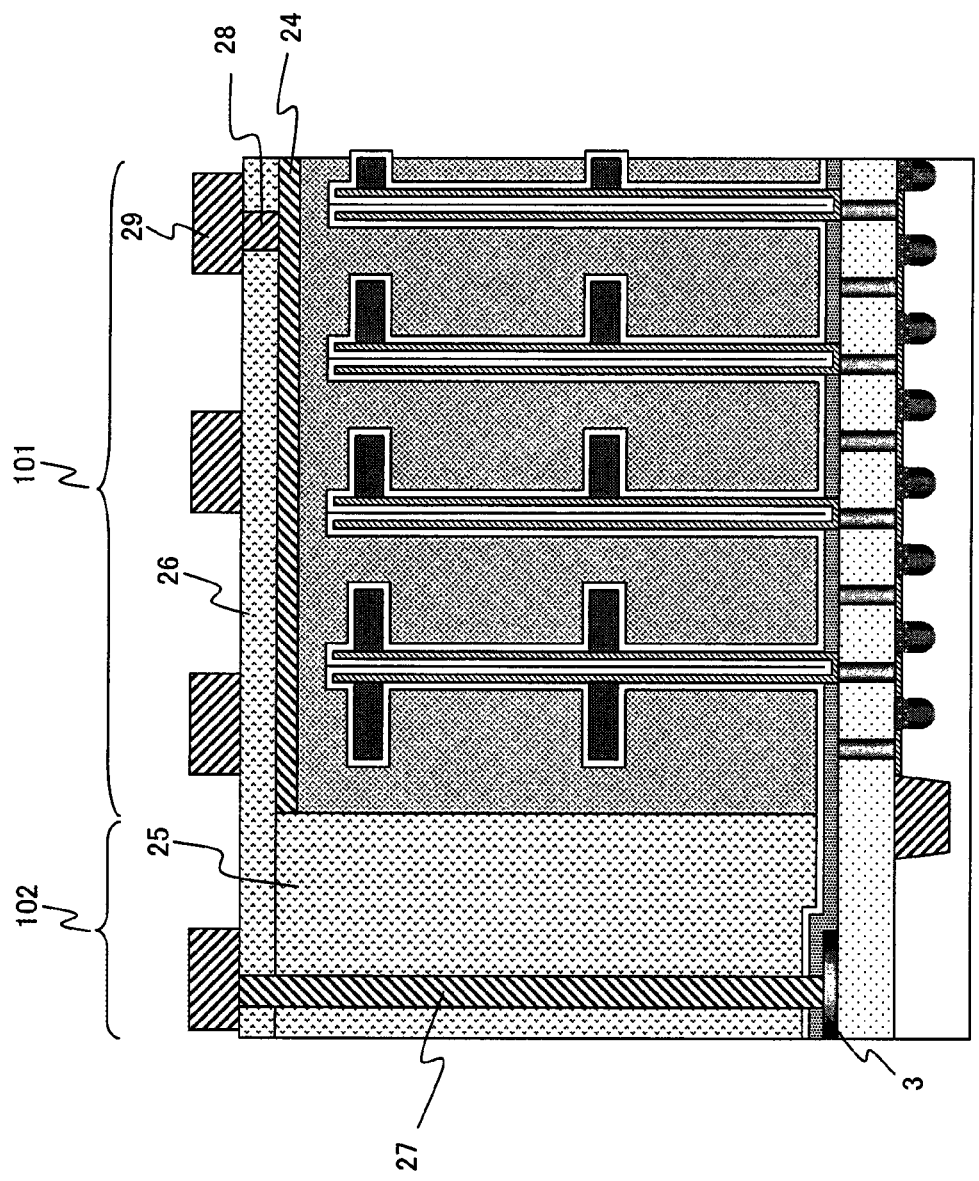
FIG. 13 is a cross-sectional view for explaining steps following the steps shown in FIGS. 12A and 12B.

Next, a tungsten film is formed on the entire surface so as to cover the upper electrode 23. A mask is formed on the tungsten film to cover the memory cell area, and then the tungsten film formed on the peripheral circuit area 102 and the upper electrode 23 located below the same are removed by etching. Thus, as shown in FIG. 13, a plate-like tungsten film 24 is formed on the upper electrode 23 in the memory cell area 101.

After that, an interlayer insulation film 25 is formed on the entire surface, and then the interlayer insulation film 25 formed on the memory cell area 101 is removed by a CMP process or the like. The interlayer insulation film 25 remains in the peripheral circuit area 102 and the surface thereof is planarized so as to be flush with the surface of the tungsten film 24.

Then, an interlayer insulation film 26 is formed on the entire surface to cover the planarized interlayer insulation film 25 and the tungsten film 24. Subsequently, a contact plug 27 connected to a wiring 2 formed in the peripheral circuit area 102 and a contact plug 28 connected to the plate-like tungsten film 24 are formed. Further, wirings 29 connected to the contact plugs 27 and 28 are formed.

After that, an interlayer insulation film and wirings not shown are further formed if required, and a DRAM is completed.

According to this embodiment, a plurality of support films is formed in stack. First openings are formed in an upper-layer support film and second openings are formed in a lower-layer support film by using the first openings. In this manner, the number of photolithography steps requiring alignment can be reduced.

In other words, according to this embodiment, openings are formed in both the second silicon nitride film 8 and the first silicon nitride film 6 by utilizing a single lithography step performed after the formation of the lower electrodes 16. This makes it possible to prevent misalignment possibly caused by repeated lithography steps.

Further, according to the embodiment, the area of the openings formed in the second silicon nitride film 8 and the first silicon nitride film 6 is made as small as possible, and the lower electrodes 16 are interconnected by means of planar support members 30 and 31 spreading two-dimensionally. This configuration is able to improve the mechanical strength in comparison with the case in which the lower electrodes are connected by means of linear beams.

When the lower electrodes are connected by means of linear beams, the arrangement of the beams becomes more difficult and deterioration in mechanical strength becomes inevitable as the density of the lower electrodes is increased. In contrast, in the configuration according to this embodiment, the arrangement of the support members 30 and 31 will not become difficult even if the density of the lower electrodes 16 is increased, and the deterioration in mechanical strength can be prevented. As a result, improvement of the yield in manufacturing semiconductor devices and the reliability of products can be realized.

Next, a manufacturing method of a semiconductor device according to a second embodiment of the invention will be described with reference to FIGS. 14A to 16B. The description will be made focusing on different points from the first embodiment.

Firstly, in the same manner as in the first embodiment, the state as shown in FIGS. 8A and 8B is obtained.

Figure 14B:
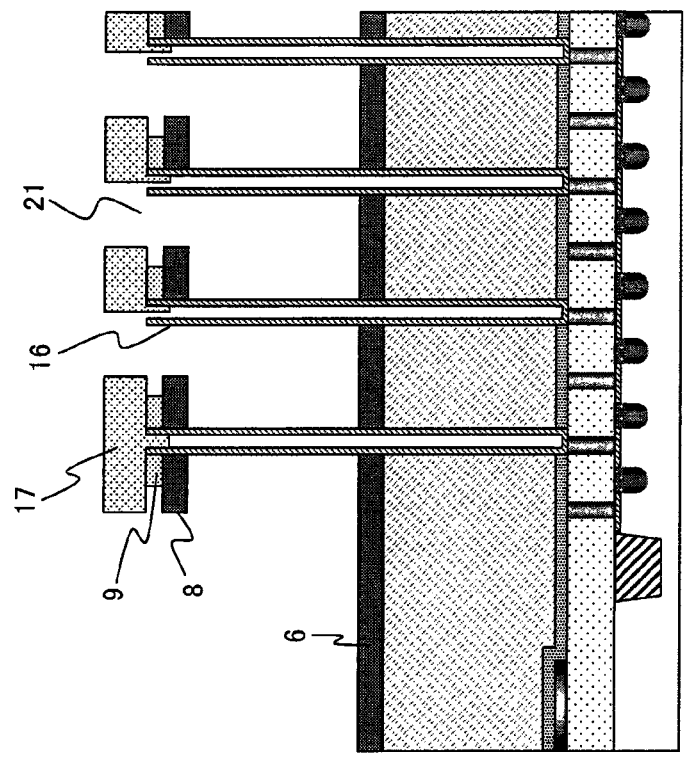
FIG. 14B is a cross-sectional view taken along the line B-B' in FIG. 14A.
Figure 14A:
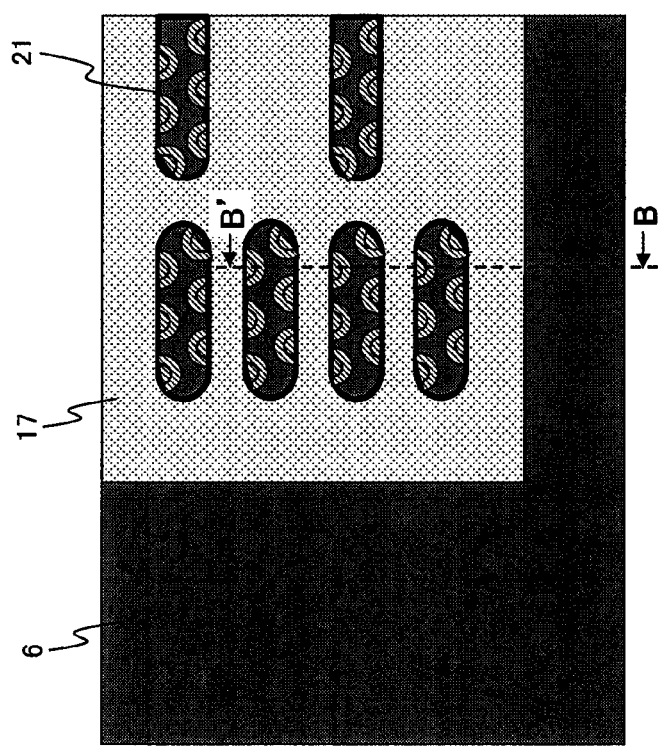
FIG. 14A is a diagram for explaining a manufacturing method of a semiconductor device according to a second embodiment of the invention, being a plan view showing a semiconductor device on the way of manufacture.

The second cylinder interlayer film 7 is then totally removed by etching with use of a hydrofluoric-acid-containing solution, whereby a state as shown in FIGS. 14A and 14B is obtained. The upper surface of the first silicon nitride film 6 is exposed by this solution etching.

During etching of the second cylinder interlayer film 7, the third cylinder interlayer film 9 is also etched from a lateral direction. However, when the third cylinder interlayer film 9 is a silicon oxide film formed by a HDP process, its etching rate can be reduced to about one tenth of the etching rate of the second cylinder interlayer film 7 that is formed of an impurity-containing silicon oxide film. Therefore, the third cylinder interlayer film 9 partially remains even after the second cylinder interlayer film 7 has been completely removed. Further, since etching openings 21 are provided within a limited range as shown in FIG. 14A, the lateral etching amount of the third cylinder interlayer film 9 is substantially negligible.

Figure 15B:
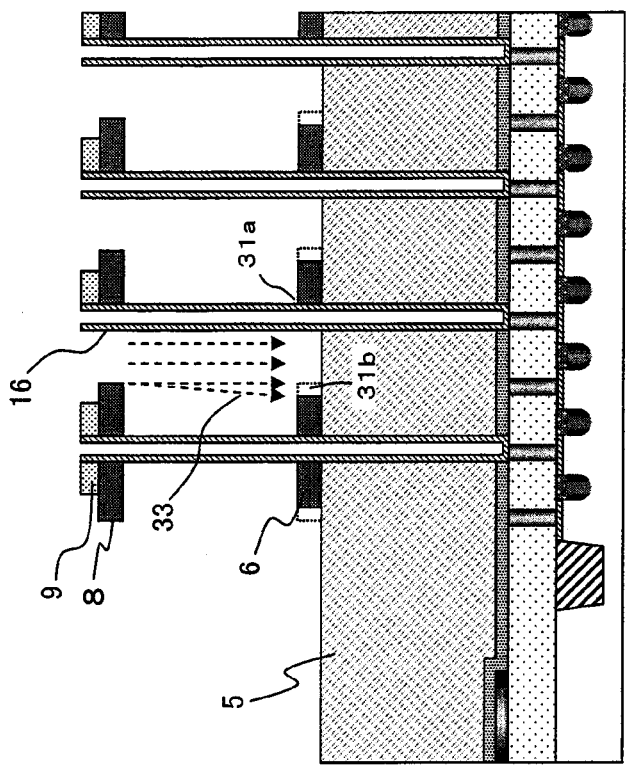
FIG. 15B is a cross-sectional view taken along the line B-B' in FIG. 15A.
Figure 15A:
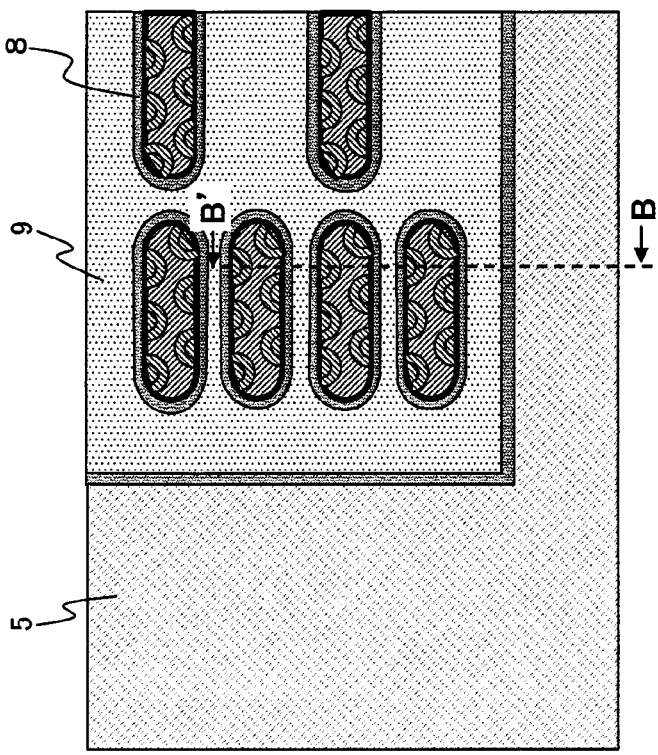
FIG. 15A is a diagram for explaining steps following the steps shown in FIGS. 14A and 14B, being a plan view showing a semiconductor device on the way of manufacture.

Next, the first silicon nitride film 6 is dry etched by fluorine-containing plasma with the plasma silicon nitride film 17 used as a mask, whereby a state as shown in FIGS. 15A and 15B is obtained.

This dry etching causes the plasma silicon nitride film 17 used as a mask to disappear, and exposes a part of the upper surface of the first cylinder interlayer film 5.

Since the second cylinder interlayer film 7 has been completely removed before this dry etching, there exists a wide space between the mask and the first silicon nitride film 6 as shown in FIG. 15B. Therefore, ions which contribute to the dry etching tend to scatter from a vertical direction, generating scattered ions 33. The generation of the scattered ions 33 causes a part (indicated by a white out section) 31$b$ of the first silicon nitride film 6 to be dry etched. This means that openings formed in the first silicon nitride film 6 will be slightly wider than openings formed in the second silicon nitride film 8. However, this expansion of the openings does not significantly affect interfaces 31$a$ where the lower electrodes 16 are connected to the first silicon nitride film 6. As seen from FIG. 15A, this is because the interfaces 31$a$ are present behind lower electrodes 16 when viewed from the side where the ions are incident. In other words, the lower electrodes 16 function as barriers to prevent ions from reaching the interfaces 31$a$. This prevents the interfaces 31$a$ between the lower electrodes 16 and the first silicon nitride film 6 from being etched away, which ensures the connection between the lower electrodes 16 and the first silicon nitride film 6.

Figure 16A:
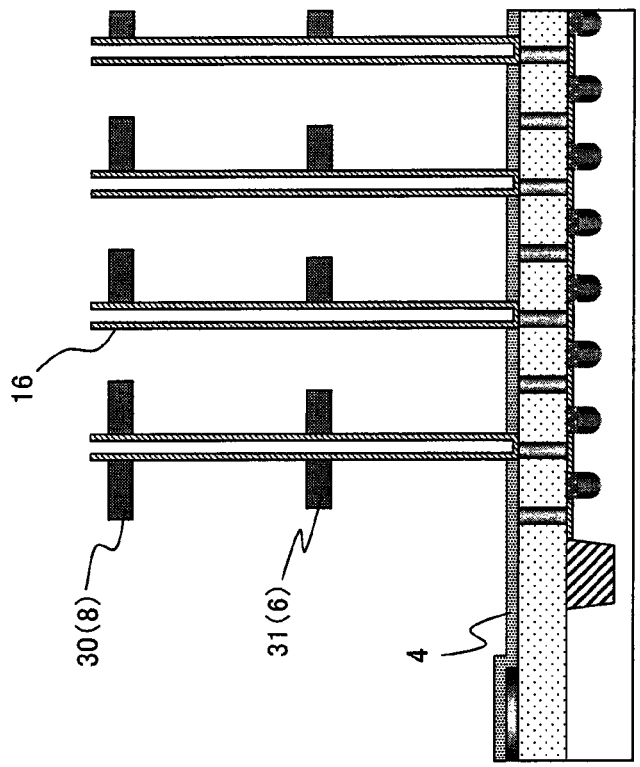
FIG. 16A is a diagram for explaining steps following the steps shown in FIGS. 15A and 15B, being a plan view showing a semiconductor device on the way of manufacture.
Figure 16B:
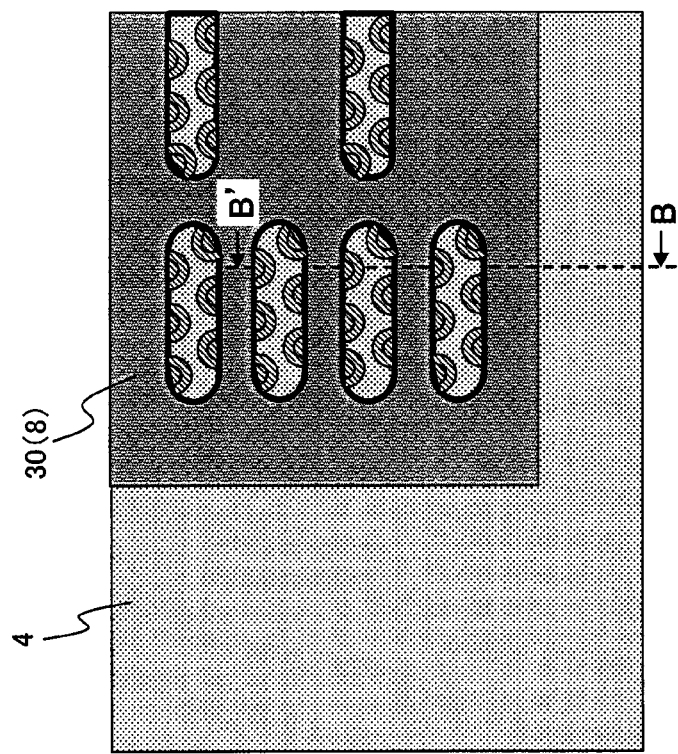
FIG. 16B is a cross-sectional view taken along the line B-B' in FIG. 16A.

After that, the first cylinder interlayer film 5 and the third cylinder interlayer film 9 are totally removed with use of a hydrofluoric-acid-containing solution. As a result, as shown in FIGS. 16A and 16B, the outer peripheral surfaces of the lower electrodes 16 are exposed except the parts where the lower electrodes 16 are connected with the first support member 30 and the second support member 31. After this, the same processes as those of the first embodiment are performed to complete a DRAM.

In the second embodiment as well, like in the first embodiment, the misalignment possibly caused by repeated lithography steps can be prevented. Further, the configuration in which the lower electrodes are interconnected by planar support members can improve the mechanical strength in comparison with the related-art in which the lower electrodes are interconnected by linear beams, and hence can improve the yield in manufacturing semiconductor devices and the reliability of products.

Referring to FIG. 17 to FIG. 20B, a manufacturing method of a semiconductor device according to a third embodiment of the invention will be described.

Figure 17:
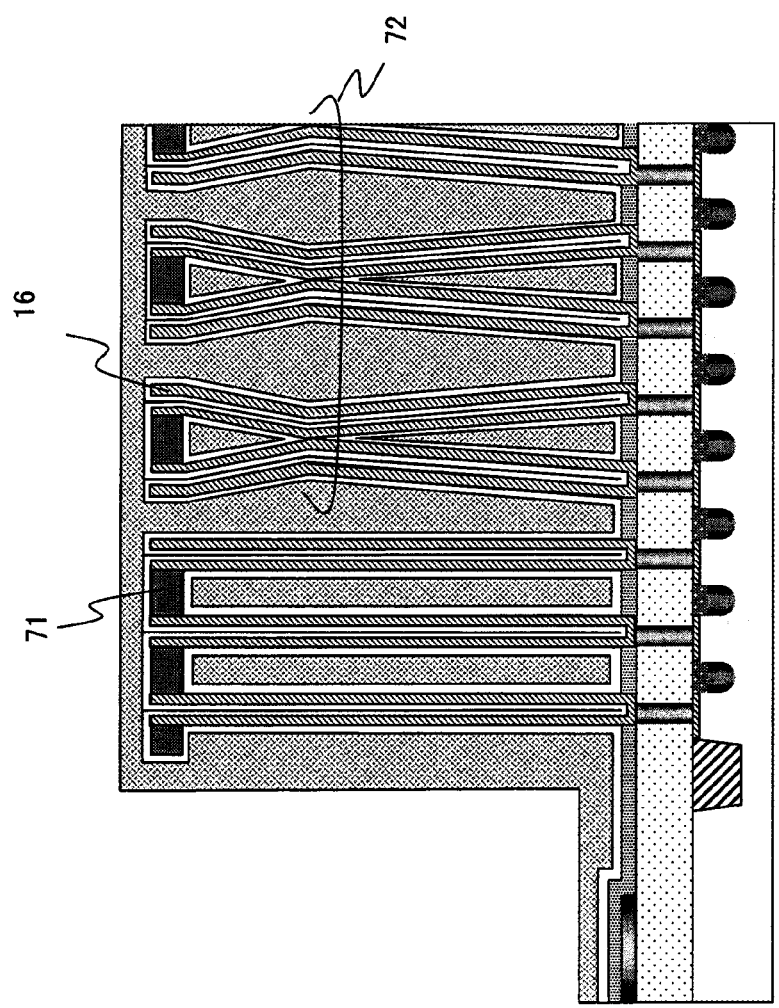
FIG. 17 is a cross-sectional view for explaining problems pertaining to semiconductor devices studied by the inventor.

FIG. 17 is a cross-sectional view for explaining findings obtained by the inventor of this invention in the course of intensive study and experimentation, as a result of which this invention has been made. Before reaching this invention, the inventor has examined the adequacy of a configuration in which the upper parts of the lower electrodes are supported by a single support film. The inventor has found that when such a configuration is employed, even though the lower electrode will not collapse, distortion 72 will be generated in the lower electrodes 16 located below a support film 71, as shown in FIG. 17, and thus the adjacent lower electrodes 16 might short-circuit with each other. The inventor also found that the generation of the distortion is concentrated in a part of each lower electrode 16 that corresponds to a depth range of 200 to 400 nm from the upper surface thereof. Further, the inventor has found that said range corresponds to a position where a phenomenon called bowing is caused. The bowing is a phenomenon in which when cylinder holes used for formation of lower electrode 16 are formed by a dry etching process, they expand in a lateral direction.

Based on these findings, the semiconductor device manufacturing method according to this third embodiment, which is a modification of the manufacturing method according to the first or second embodiment, forms a third support film in those sites where bowing may occur. This will be described in detail below.

Figure 18B:
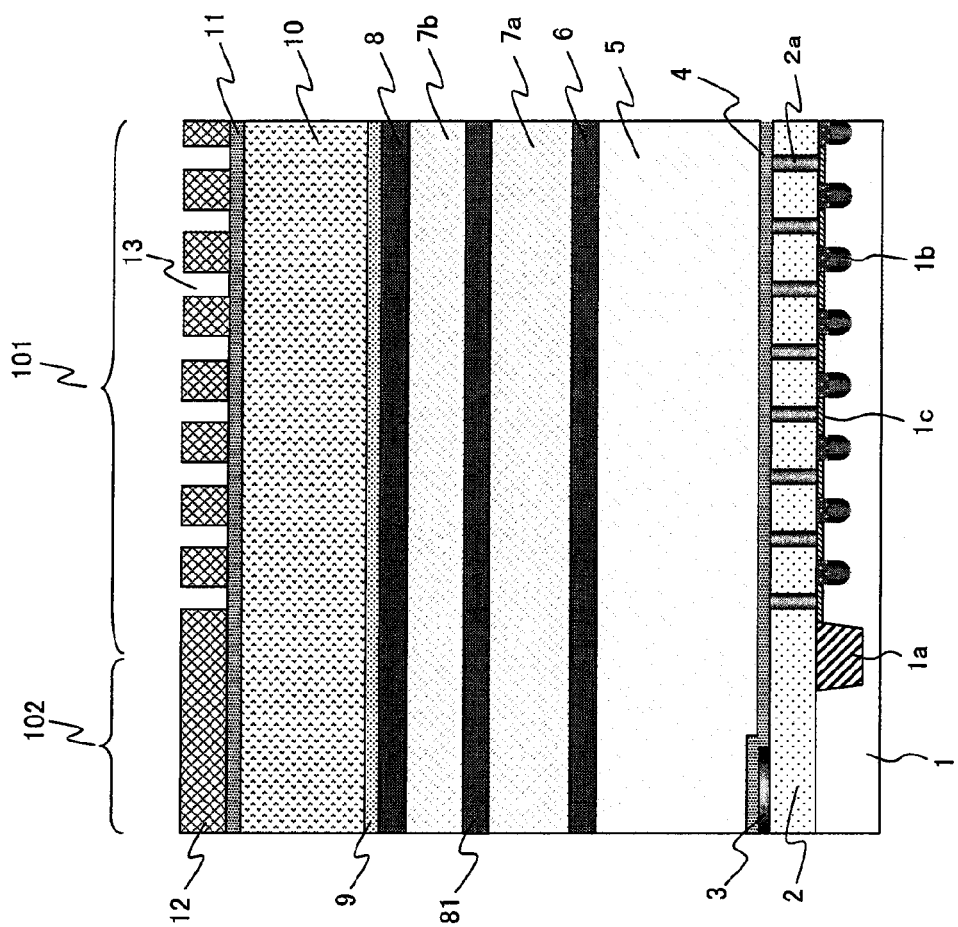
FIG. 18B is a cross-sectional view taken along the line B-B' in FIG. 18A.
Figure 18A:
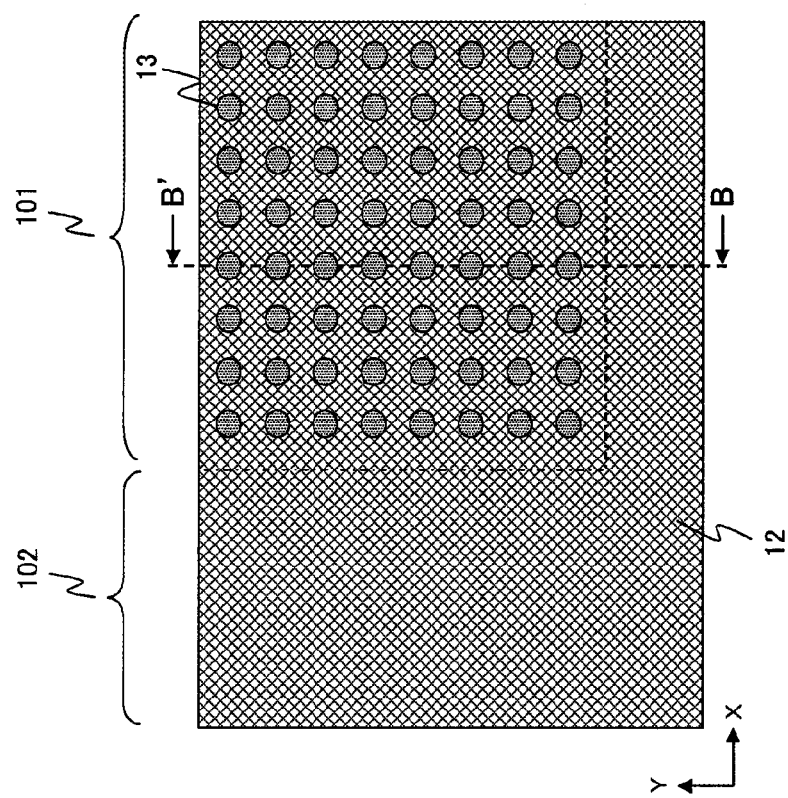
FIG. 18A is a diagram for explaining a manufacturing method of a semiconductor device according to a third embodiment of the invention, being a plan view showing a semiconductor device on the way of manufacture.

Firstly, in order to obtain a state as shown in FIGS. 18A and 18B, a plurality of films are formed on a semiconductor substrate 1 on which circuits or the like have been formed in the same manner as in the first embodiment. The third embodiment differs from the first embodiment in that in order to arrange a third silicon nitride film between the first silicon nitride film 6 and the second silicon nitride film 8, the second cylinder interlayer film 7 is divided into a lower layer 7$a$ (second sacrificial film) and an upper layer 7$b$ (third sacrificial film), and a third silicon nitride film 81 (third support film) is formed between these layers. The third silicon nitride film 81 can be formed in the same manner as the first or second silicon nitride film 6 or 8.

Figure 19B:
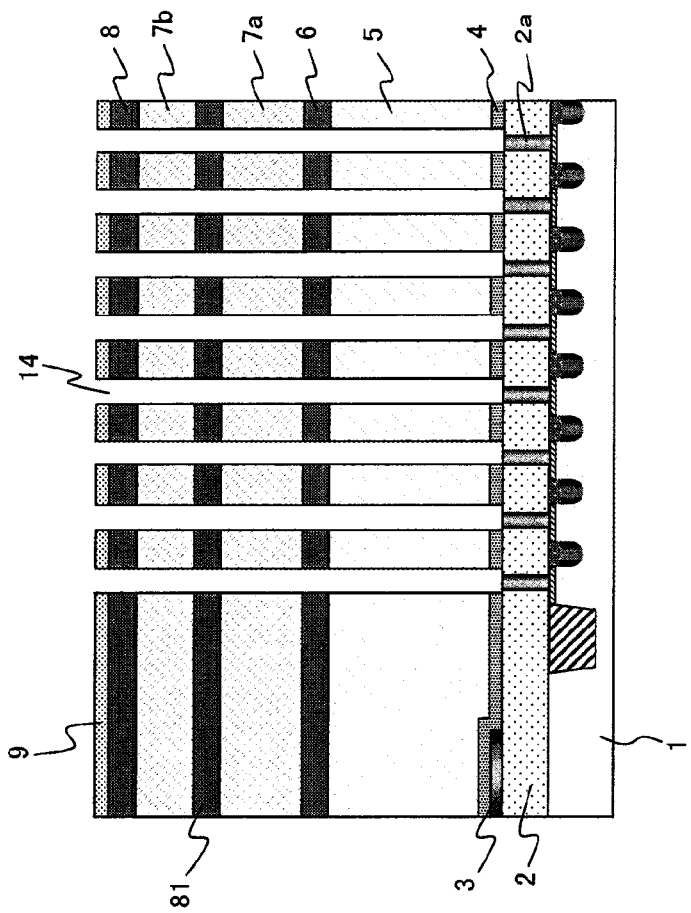
FIG. 19B is a cross-sectional view taken along the line B-B' in FIG. 19A.
Figure 19A:
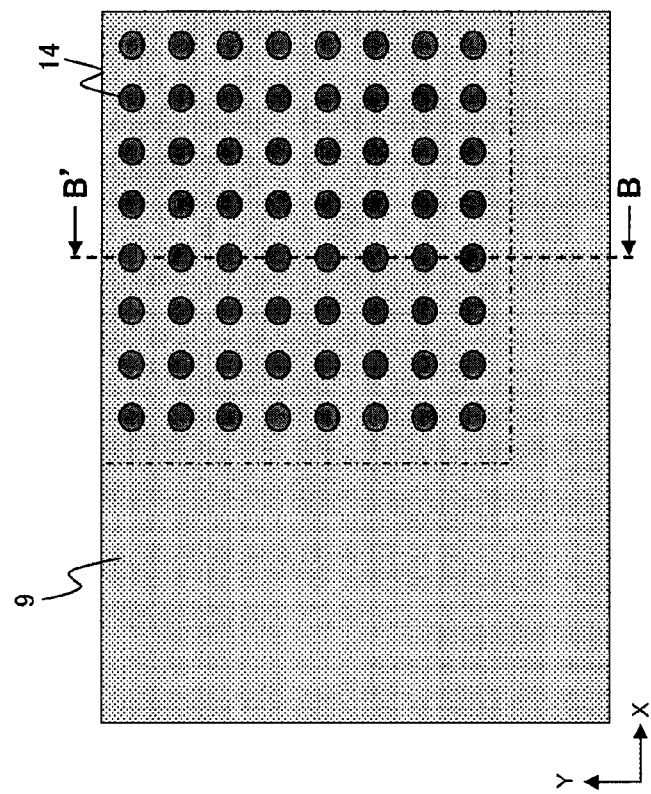
FIG. 19A is a diagram for explaining steps following the steps shown in FIGS. 18A and 18B, being a plan view showing a semiconductor device on the way of manufacture.

Next, likewise the first embodiment, the cylinder hole pattern 13 of the photoresist 12 is transferred to the silicon oxide film 11, and then the cylinder hole pattern 13 is further transferred to the amorphous carbon film 10. Using the amorphous carbon film 10 as a mask, the third cylinder interlayer film 9, the second silicon nitride film 8, the upper layer second cylinder interlayer film 7$b$, the third silicon nitride film 81, the lower layer second cylinder interlayer film 7$a$, the first silicon nitride film 6, the first cylinder interlayer film 5, and the stopper silicon nitride film 4 are sequentially etched by a dry etching process using fluorine-containing plasma, so that cylinder holes 14 are formed as shown in FIGS. 19A and 19B.

Figure 20B:
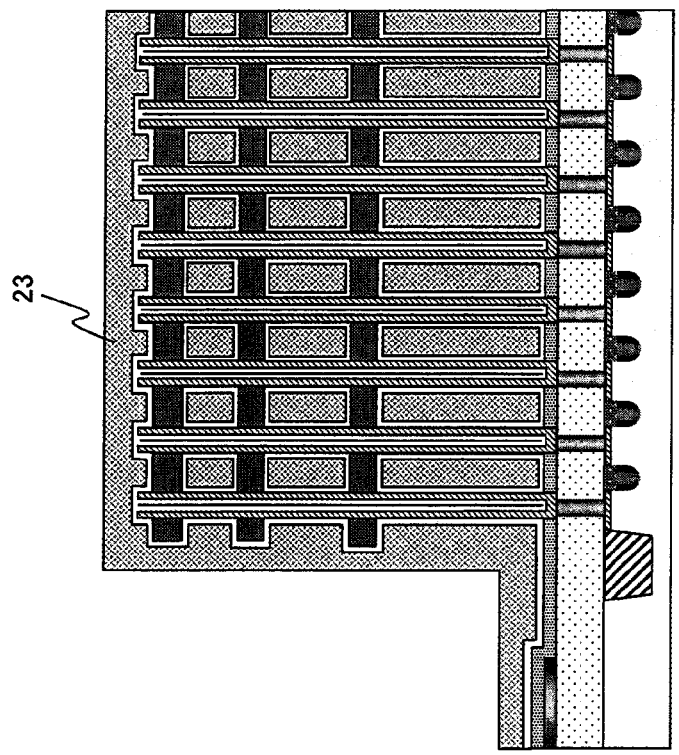
FIG. 20B is a cross-sectional view taken along the line B-B' in FIG. 20A.
Figure 20A:
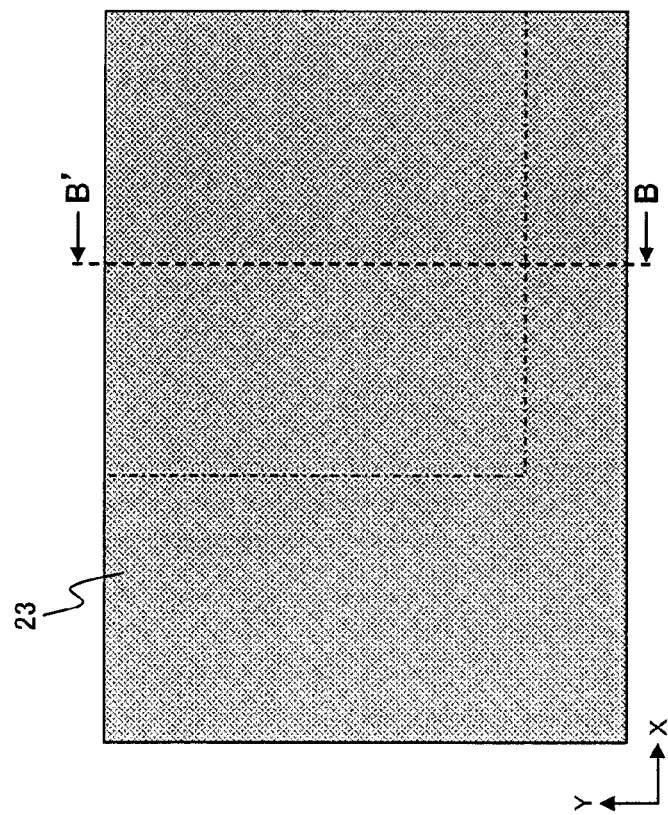
FIG. 20A is a diagram for explaining steps following the steps shown in FIGS. 19A and 19B, being a plan view showing a semiconductor device on the way of manufacture.

After that, the lower electrodes 16 are formed by the same processes as in the first embodiment. Further, etching openings 21 are formed in the second silicon nitride film 8, the upper layer second cylinder interlayer film 7$b$, the third silicon nitride film 81, the lower layer second cylinder interlayer film 7$a$, and the first silicon nitride film 6. This means that the openings in the first silicon nitride film 6 as well as the openings (third openings) in the third silicon nitride film are formed by a single dry etching process. Further, the upper layer second cylinder interlayer film 7$b$, the lower layer second cylinder interlayer film 7$a$ and the first cylinder interlayer film 5 are completely removed to expose the outer peripheral walls of the lower electrodes. An upper electrode 23 is then formed to obtain a state as shown in FIGS. 20A and 20B.

After that, interlayer insulation films, wiring and so on as necessary are formed in the same manner as in the first embodiment, whereby a DRAM is completed.

While the semiconductor device manufacturing method in which the third silicon nitride film is provided as a third support member by the same processes as those of the first embodiment has been described above, it is also possible to manufacture a semiconductor device having the third silicon nitride film as a third support member, by the same processes as those of the second embodiment.

According to this third embodiment in which three support films are provided, the mechanical strength is improved, and the lower electrodes can be effectively prevented from collapsing or distortion. Additionally, the support film provided at a position corresponding to a depth of 200 nm to 400 nm below the cylinder top is able to prevent occurrence of bowing during formation of the cylinder holes (during dry etching).

Although the invention has been described based on several exemplary embodiments thereof, the invention is not limited to these embodiments but may be variously modified or changed. For example, the invention is applicable not only to DRAMs but also to other semiconductor devices. Further, the first support film according to the first and second embodiments can be provided at a position where bowing tends to occur during formation of the cylinder holes. This makes it possible to effectively prevent the lower electrodes from collapsing and distortion.

What is claimed is:

1. A manufacturing method of a device comprising:
   sequentially forming a first sacrificial film, a first support film, a second sacrificial film, and a second support film on a semiconductor substrate;
   forming a hole to pass through the second support film, the second sacrificial film, the first support film, and the first sacrificial film;
   forming a crown-shaped electrode covering an inner surface of the hole and connected to the second support film and the first support film;
   forming a first opening in the second support film into a first pattern which is designed such that a connection between the crown-shaped electrode and the second support film is at least partially maintained;
   removing at least a part of the second sacrificial film through the first opening;
   forming a second opening in the first support film with use of the first opening; and
   removing the first sacrificial film through the second opening.

2. The manufacturing method of a device according to claim 1, wherein the formation of the second opening is performed by anisotropic dry etching.

3. The manufacturing method of a device according to claim 2, wherein the formation of the first opening, the partial removal of the second sacrificial film, and the formation of the second opening are carried out successively by a single dry etching step.

4. The manufacturing method of a device according to claim 2, wherein after the formation of the first opening, the second sacrificial film is totally removed by solution etching, and then the formation of the second opening is performed by dry etching through the first opening.

5. The manufacturing method of a device according to claim 2, wherein:
   a third support film and a third sacrificial film are sequentially formed after the formation of the second sacrificial film and before the formation of the second support film; and
   formation of a third opening in the third support film with use of the first opening is performed in the same process as the formation of the second opening in the first support film.

6. The manufacturing method of a device according to claim 1, wherein the first pattern is designed such that an area of a remaining part of the second support film after the formation of the first opening is greater than an area of the first opening.

7. The manufacturing method of a semiconductor device according to claim 6, wherein the first pattern has an oblong shape with rounded corners that is arranged such that a part of the crown-shaped electrode is located on the inner circumferential side while the remaining part is located on the outer circumferential side.

8. The manufacturing method of a device according to claim 7, wherein a plurality of the crown-shaped electrodes correspond to the first opening.

9. The manufacturing method of a device according to claim 1, wherein the first sacrificial film and the second sacrificial film are made of a silicon oxide film, and the first support film and the second support film are made of a silicon nitride film.

10. The manufacturing method of a device according to claim 1, wherein a cylinder interlayer film is formed on the second support film before the formation of the hole.

11. The manufacturing method of a device according to claim 1, wherein the formation of the second opening is performed such that connection between the crown-shaped electrode and the first support film is at least partially maintained.

12. A manufacturing method of a device comprising:
    stacking alternately a plurality of sacrificial films and a plurality of support films;
    forming a crown-shaped electrode which passes through the plurality of sacrificial film layers and the plurality of support film layers and is connected to the plurality of support film layers;
    forming a first opening in an uppermost layer of the plurality of support film layers, into a first pattern which is designed such that the connection with the crown-shaped electrode is at least partially maintained;
    forming a corresponding opening corresponding to the first opening in each of the plurality of support film layers except for the upper most layer with use of the first opening such that the connection with the crown-shaped electrode is at least partially maintained for all of the plurality of support film layers except for the upper most layer; and
    removing the plurality of sacrificial films through the first opening and the corresponding opening.

* * * * *